US011666924B2

(12) United States Patent
Neiser

(10) Patent No.: US 11,666,924 B2
(45) Date of Patent: *Jun. 6, 2023

(54) APPARATUS AND METHODS FOR SELECTIVELY TRANSMITTING OBJECTS

(71) Applicant: Paul Neiser, Mountain View, CA (US)

(72) Inventor: Paul Neiser, Mountain View, CA (US)

(*) Notice: Subject to any disclaimer, the term of this patent is extended or adjusted under 35 U.S.C. 154(b) by 241 days.

This patent is subject to a terminal disclaimer.

(21) Appl. No.: 16/277,904

(22) Filed: Feb. 15, 2019

(65) Prior Publication Data

US 2019/0247863 A1 Aug. 15, 2019

Related U.S. Application Data

(60) Provisional application No. 62/710,602, filed on Feb. 17, 2018, provisional application No. 62/710,341, filed on Feb. 15, 2018.

(51) Int. Cl.
| | |
|---|---|
| *B03C 7/12* | (2006.01) |
| *B03C 3/49* | (2006.01) |
| *B03C 1/28* | (2006.01) |
| *H01J 37/143* | (2006.01) |
| *B03C 1/30* | (2006.01) |
| *B03C 5/02* | (2006.01) |
| *B03C 5/00* | (2006.01) |
| *G02B 21/32* | (2006.01) |

(52) U.S. Cl.
CPC ........... *B03C 7/12* (2013.01); *B03C 1/288* (2013.01); *B03C 1/30* (2013.01); *B03C 3/49* (2013.01); *B03C 5/005* (2013.01); *B03C 5/026* (2013.01); *H01J 37/143* (2013.01); *G02B 21/32* (2013.01)

(58) Field of Classification Search
None
See application file for complete search history.

(56) References Cited

U.S. PATENT DOCUMENTS

| | | |
|---|---|---|
| 1,329,559 A | 2/1920 | Tesla |
| 1,424,932 A | 8/1922 | Moreau |
| 2,574,865 A | 11/1951 | Edwards |
| 3,611,679 A | 10/1971 | Pall |
| 3,790,829 A | 2/1974 | Roth |

(Continued)

FOREIGN PATENT DOCUMENTS

| | | |
|---|---|---|
| CN | 102481118 A | 5/2012 |
| CN | 105050764 A | 11/2015 |

(Continued)

OTHER PUBLICATIONS

Number Density, https://en.wikipedia.org/wiki/Number_density, Accessed Jul. 25, 2022, pp. 1-3. (Year: 2022).*

(Continued)

*Primary Examiner* — Peter Keyworth
(74) *Attorney, Agent, or Firm* — Schwegman Lundberg & Woessner, P.A.

(57) ABSTRACT

Apparatuses and methods for selectively transmitting objects of interest from a first reservoir to a second reservoir are disclosed. The apparatuses include electromagnetic focusing apparatuses configured to interact with objects of interest to induce a change in a property of the objects of interest so as to increase or decrease the probability that the objects of interest pass through a throat diffusively coupling the first reservoir and the second reservoir.

59 Claims, 2 Drawing Sheets

(56) References Cited

U.S. PATENT DOCUMENTS

| | | |
|---|---|---|
| 3,974,824 A | 8/1976 | Smith |
| 3,993,564 A | 11/1976 | Novak |
| 4,262,840 A | 4/1981 | Gronert et al. |
| 4,285,704 A | 8/1981 | Zuzanov |
| 4,482,365 A | 11/1984 | Roach |
| 4,535,440 A | 8/1985 | Mannschke |
| 4,850,806 A | 7/1989 | Morgan et al. |
| 4,854,825 A | 8/1989 | Bez et al. |
| 4,906,837 A | 3/1990 | Doneen et al. |
| 5,174,113 A | 12/1992 | Deville |
| 5,441,576 A | 8/1995 | Bierschenk |
| 5,454,472 A | 10/1995 | Brenecke et al. |
| 5,648,874 A | 7/1997 | Sawaki et al. |
| 5,657,408 A | 8/1997 | Ferm et al. |
| 5,738,731 A | 4/1998 | Shindo et al. |
| 5,851,507 A | 12/1998 | Pirzada et al. |
| 6,388,819 B1 | 5/2002 | Leidig |
| 6,903,261 B2 | 6/2005 | Habraken et al. |
| 7,170,112 B2 | 1/2007 | Ning |
| 7,286,296 B2 | 10/2007 | Chaves et al. |
| 7,444,961 B1 | 11/2008 | Ellis |
| 7,879,123 B2 | 2/2011 | Lundquist et al. |
| 7,993,051 B2 | 8/2011 | Arnaud |
| 8,698,094 B1 | 4/2014 | Sears et al. |
| 8,803,340 B2 | 8/2014 | Moddel |
| 9,364,165 B2 | 6/2016 | Gleich |
| 9,535,059 B2 | 1/2017 | Tai et al. |
| 9,691,923 B2 | 6/2017 | Brunton et al. |
| 9,698,094 B2 | 7/2017 | Yanagisawa et al. |
| 9,744,533 B2 | 8/2017 | Breinlinger et al. |
| 9,815,055 B2 | 11/2017 | West et al. |
| 10,207,315 B2 | 2/2019 | Appleby et al. |
| 2002/0102058 A1 | 8/2002 | Hulse |
| 2002/0187560 A1 | 12/2002 | Pezzuto et al. |
| 2003/0019807 A1 | 1/2003 | Beard et al. |
| 2004/0022506 A1 | 2/2004 | Arkas |
| 2005/0056311 A1 | 3/2005 | Son |
| 2005/0088734 A1 | 4/2005 | Basu |
| 2006/0033035 A1 | 2/2006 | Itzkovitch et al. |
| 2007/0018764 A1 | 1/2007 | Martinez et al. |
| 2007/0223867 A1 | 9/2007 | Hwang et al. |
| 2008/0067396 A1 | 3/2008 | Oshima |
| 2008/0078289 A1 | 4/2008 | Sergi et al. |
| 2008/0106796 A1 | 5/2008 | Kawada |
| 2008/0176174 A1 | 7/2008 | White et al. |
| 2009/0093105 A1 | 4/2009 | Kobayashi et al. |
| 2009/0152176 A1 | 6/2009 | Kipp et al. |
| 2009/0272082 A1 | 11/2009 | Nahey et al. |
| 2010/0237198 A1 | 9/2010 | Cormier |
| 2010/0265597 A1 | 10/2010 | Shyu |
| 2011/0257675 A1 | 10/2011 | Mackiewicz |
| 2012/0125000 A1 | 5/2012 | Rodriguez-Arango et al. |
| 2012/0137652 A1 | 6/2012 | Asprey et al. |
| 2012/0217876 A1 | 8/2012 | Diamant et al. |
| 2012/0255913 A1 | 10/2012 | Tung et al. |
| 2013/0087506 A1 | 4/2013 | Danov et al. |
| 2013/0140468 A1 | 6/2013 | Chen |
| 2013/0175171 A1* | 7/2013 | Aizel ................ B01D 61/427 204/453 |
| 2013/0283797 A1 | 10/2013 | Bressi |
| 2014/0003460 A1 | 1/2014 | Keyser et al. |
| 2014/0137941 A1 | 5/2014 | Orsley |
| 2014/0333514 A1 | 11/2014 | Dupong Skovsby |
| 2015/0049491 A1 | 2/2015 | Venkataraman et al. |
| 2015/0114305 A1 | 4/2015 | Goodrick |
| 2015/0231573 A1 | 8/2015 | Sanderson |
| 2015/0360237 A1 | 12/2015 | Hayes et al. |
| 2016/0158708 A1 | 6/2016 | Lee et al. |
| 2016/0359212 A1 | 8/2016 | Houle |
| 2017/0287977 A1 | 10/2017 | Moroz |
| 2018/0323359 A1 | 11/2018 | Li et al. |
| 2019/0120213 A1 | 4/2019 | Pederson |
| 2019/0186786 A1 | 6/2019 | Neiser |
| 2019/0247863 A1 | 8/2019 | Neiser |
| 2019/0247885 A1 | 8/2019 | Neiser |
| 2019/0255536 A1 | 8/2019 | Neiser |
| 2019/0299136 A1 | 10/2019 | Neiser |
| 2019/0352022 A1 | 11/2019 | De Biase |

FOREIGN PATENT DOCUMENTS

| | | |
|---|---|---|
| CN | 112005147 A | 11/2020 |
| CN | 112041724 | 12/2020 |
| CN | 112074349 A | 12/2020 |
| EP | 2149710 A2 | 2/2010 |
| EP | 2681455 | 1/2014 |
| EP | 3752293 A1 | 12/2020 |
| EP | 3752876 A1 | 12/2020 |
| FR | 2741161 | 5/1997 |
| GB | 837391 | 6/1960 |
| WO | 2007016800 | 2/2007 |
| WO | 2012118991 | 9/2012 |
| WO | 2014065663 | 5/2014 |
| WO | 2014106821 | 7/2014 |
| WO | 2016191606 | 12/2016 |
| WO | 2019161297 | 8/2019 |
| WO | 2019161346 | 8/2019 |
| WO | 2020117712 | 6/2020 |

OTHER PUBLICATIONS

Neumaier, Arnold, "Learn The Top Misconceptions About Virtual Particles", retrieved from the Internet: <URL: https://www.physicsforums.com/insights /misconceptions-virtual-particles/>, Apr. 6, 2016 (Apr. 6, 2016), XP055586550, 9 pages.

Strassler, Matt, "Virtual Particles: What Are They?", retrieved from the Internet: <URL: https://profmattstrassler.com/articles-and-posts/particle-physics-basics/virtual-particles-what-are-they/>, Nov. 10, 2011 (Nov. 10, 2011), XP055586547, 5 pages.

Wang, Xiang et al., "Concentration Gradient Generation Methods Based on Microfluidic Systems", Royal Society of Chemistry, Jul. 2017, pp. 29966-29984.

Goudie, Marcus J., et al., "Investigation of Diffusion Characteristics Through Microfluidic Channels for Passive Drug Delivery Applications", Journal of Drug Delivery, vol. 2016, Article ID 7913616, Hindawi Publishing Corporation, May 4, 2016, 10 pages.

Abalde-Cela, Sara, et al., "Droplet Microfluidics for the Highly Controlled Synthesis of Branched Gold Nanoparticles", Scientific Reports, vol. 8, Jan. 22, 2018, pp. 1-6.

Abramowitz, Mortimer, et al., "Concepts in Digital Imaging Technology", Hamamatsu Learning Center: Microlens Arrays, http://hamamatsu.magnet.fsu.edu/articles/microlensarray .html, Jan. 17, 2019, pp. 1-4.

Elder, Ian F., et al., "A Hollow Waveguide Integrated Optic QCL Beam Combiner", http://proceedings.spiedigitallibrary.org/ on Nov. 15, 2012 Terms of Use: http://spiedl.org/terms, Proc. of SPIE vol. 8543, pp. 854306-1-854306-11.

Hehlen, Markus P., et al., "Solid-State Optical Refrigeration", Handbook on the Physics and Chemistry of Rare Earths,vol. 46, pp. 1-151.

Adbul-Majid, Sawsan et al., "Photonic Integrated Interferometer Based on Silicon-on-Insulator Nano-Scale MMI Couplers", IEEE, 2013, pp. 337-338.

Adams, Charles S., "Laser Cooling and Manipulation of Neutral Particles", to appear in: The New Optics Cambridge University Press, pp. 1-39.

Seletskiy, Denis V., et al., "Laser Cooling in Solids: Advances and Prospects", Reports on Progress in Physics, vol. 79, No. 096401, 2016, This Accepted Manuscript is ©© 2016 IOP Publishing Ltd., pp. 1-51.

Chu, Jennifer, "Engineers Design 'Tree-on-a-Chip': Microfluidic Device Passive Hydraulic Power", Physic.org 2013-2019, Science X network, Mar. 20, 2017, https://phys.org/news/2017-03-tree-on-a-chip-microfluidic-device-passiv, pp. 1-5.

Weigl, Bernhard H., et al., "Microfluidic Diffusion-Based Separation and Detection", Science, vol. 283, Issue 5400, Jan. 15, 1999, http://science.sciencemag.org/content/283/5400/346, pp. 346-347.

(56) References Cited

OTHER PUBLICATIONS

Nguyen, Nam-Trung, "Micro-Optofluidic Lenses: A Review", Biomicrofluidics, vol. 4, No. 031501, American Institute of Physics, 2010, pp. 031501-1-031501-5.

Su, Tiehui, et al., "Experimental Demonstration of Interferometric Imaging Using Photonic Integrated Circuits", Optics Express, vol. 25, No. 11, May 29, 2017, pp. 12653-12665.

Paie, Petra, et al., "Particle Manipulation by Optical Forces in Microfluidic Devices", Micromachines, www.mdpi.com/journal/micromachines, 2018, pp. 1-21.

Wikipedia, Passive Transport, <https://en.wikipedia.org/wiki/Passive_transport>, Jan. 17, 2019, pp. 1-3.

Stanton, Eric J., et al., Multi-Octave Spectral Beam Combiner on Ultrabroadband Photonic Integrated Circuit Platform, Optics Express, vol. 23, No. 9, May 4, 2015, pp. 11272-11283.

Microlens Arrays, Thorlabs, <https://www.thorlabs.com/newgrouppage9.cfm?objectgroup_id=2861>, Jan. 17, 2019, pp. 1-3.

Ladislas Wiza, Joseph, "Microchannel Plate Detectors", Nuclear Instruments and Methods, vol. 162, Mar. 8, 1979, pp. 587-601.

Boyd, John, "New Carbon Nanotube Sheets Claim World's Top Heat-Sink Performance", IEEE Spectrum, Dec. 7, 2017 (Year: 2017), 3 pages.

Chandler, David L., "MIT News on Campus and Around the World: Explained: Phonons", <URL: https://news.mit.edu/2010/explained-phonons-0706>, Jul. 8, 2010 (Year: 2010), 3 pages.

Chen, Liu, et al., "Effect of the Diffuser on Diesel Turbocharger Compression Performance and Noise Emission", Proceedings of the ASME 2017 Internal Combustion Engine Division Fall Technical Conference (ICEF2017), Oct. 15-18, 2017 (Year: 2017), 9 pages.

DeBiase, Robert, "Can Casimir Forces be Asymmetric?", Proceedings of the Seventh Conference on Future Energy, Albuquerque, New Mexico, Jul. 30-Aug. 1, 2015, <URL: https://web.archive.org/web/20170825135618/integrityresearchinstitute.org/cofe.html>, 16 pages.

Doering, Charles R., et al., "Nonequilibrium Fluctuation-Induced Transport", Physical Review Letters, vol. 72, No. 19, May 9, 1994, 4 pages.

Esposito, Angelo, et al., "Gravitational Mass Carried by Sound Waves", Physical Review Letters, vol. 122, No. 084501, Mar. 1, 2019 (Year: 2019), pp. 084501-1-084501-6.

Koks, Don, "What is the Mass of a Photon?", <URL: https://math.ucr.edu/home/baez/physics/ParticleAndNuclear/photon_mass.html#:-:text=Photons%20are%20traditionally%20said%20to,the%20language%20of%20special%20relativity.&text=When%20the%20particle%20is%20at,%22rest%20mass%22%20mrest>, (Year: 2008), 2 pages.

Linke, H., et al., "A Quantum Dot Ratchet: Experiment and Theory", Europhysics Letters, vol. 44, No. 3, Nov. 1, 1998, <URL: https://www.researchgate.net/profile/P_Omling/publication/231007281_A_quantum_dot_ratchet_Experiment_and_theory/links/0deec52126cb350c59000000.pdf >, pp. 341-347.

Lorke, A., et al., "Far-Infrared and Transport Properties of Antidot Arrays with Broken Symmetry", Physica B 249-251, 1998, <URL: https://www.nano.physik.lmu.de/nanophysics/_assets/pdf/1998/98-12_Lorke_PhysicaB.pdf >, pp. 312-316.

Ninth International Conference on Future Energy-COFE9, Jul. 28-29, 2017, <URL: https://web.archive.org/web/20170825135618/integrityresearchinstitute.org/cofe.html>, 7 pages.

Sahai, R., "Membrane Separations / Filtration", Encyclopedia of Separation Science, Jan. 1, 2000 (Jan. 1, 2000), XP055627471, ISBN 978-0-12-226770-3, 001: 10.1016/BO-12-226770-2/05151-6, pp. 1717-1724.

Song, A. M., et al., "Nonlinear Electron Transport in an Asymmetric Microjunction: A Ballistic Rectifier", Physical Review Letters, vol. 80, No. 17, Apr. 27, 1998, <URL: https://www.nano.physik.uni-muenchen.de/nanophysics/_assets/pdf/1998/98-03_Song_BallRect_PRL.pdf>, pp. 3831-3834.

Springer, F., et al., "Study of the Effect of Geometry on Wall Shear Stress and Permeate Flux for Ceramic Membranes: CFD and Experimental Approaches", Engineering Applications of Computational Fluid Mechanics, vol. 4, No. 1, (Year: 2010), DOI: 10.1080/19942060.2010.11015296, published online Nov. 19, 2014, pp. 17-28.

Leff, Harvey S., "Teaching the Photon Gas in Introductory Physics", American Journey of Physics, vol. 70, No. 8, Aug. 2002, pp. 792-797.

"U.S. Appl. No. 16/278,705, Final Office Action dated Mar. 8, 2022", 7 pgs.

"U.S. Appl. No. 16/278,705, Non Final Office Action dated May 21, 2021", 15 pgs.

"U.S. Appl. No. 16/278,705, Notice of Non-Compliant Amendment dated Feb. 11, 2021", 2 pgs.

"U.S. Appl. No. 16/278,705, Preliminary Amendment filed Apr. 12, 2019", 3 pgs.

"U.S. Appl. No. 16/278,705, Preliminary Amendment filed May 31, 2019", 3 pgs.

"U.S. Appl. No. 16/278,705, Preliminary Amendment filed Jul. 14, 2020", 12 pgs.

"U.S. Appl. No. 16/278,705, Response filed Feb. 5, 2021 to Restriction Requirement dated Feb. 5, 2021", 8 pgs.

"U.S. Appl. No. 16/278,705, Response filed Feb. 11, 2021 to Notice of Non-Compliant Amendment dated Feb. 11, 2021", 8 pgs.

"U.S. Appl. No. 16/278,705, Response filed Nov. 19, 2021 to Non Final Office Action dated May 21, 2021", 17 pgs.

"U.S. Appl. No. 16/278,705, Restriction Requirement dated Feb. 5, 2021", 7 pgs.

"Chinese Application Serial No. 201980025759.6, Office Action dated Feb. 28, 2022", w/English Translation, 8 pgs.

"Chinese Application Serial No. 201980025761.3, Office Action dated Feb. 21, 2022", w/English Translation, 15 pgs.

"International Application Serial No. PCT/US2019/018345, International Search Report dated Jun. 7, 2019", 4 pgs.

"International Application Serial No. PCT/US2019/018345, Written Opinion dated Jun. 7, 2019", 10 pgs.

"International Application Serial No. PCT/US2019/018345, International Preliminary Report on Patentability dated Aug. 27, 2020", 12 pgs.

"International Application Serial No. PCT/US2019/018442, International Search Report dated May 28, 2019", 4 pgs.

"International Application Serial No. PCT/US2019/018442, Written Opinion dated May 28, 2019", 10 pgs.

"International Application Serial No. PCT/US2019/018442, International Preliminary Report on Patentability dated Aug. 27, 2020", 12 pgs.

"U.S. Appl. No. 16/278,705, Non Final Office Action dated Sep. 26, 2022", 6 pgs.

"U.S. Appl. No. 16/278,705, Response to Final Office Action dated Mar. 8, 2022 filed Sep. 8, 2022", 25 pgs.

"Chinese Application Serial No. 201980025759.6, Response filed Sep. 13, 2022 to Office Action dated Feb. 28, 2022", w/ English Claims, 33 pgs.

"Chinese Application Serial No. 201980025761.3, Response filed Sep. 8, 2022 to Office Action dated Feb. 21, 2022", w/ English Claims, 12.

"European Application Serial No. 1913599.9, Noting of loss of rights dated Dec. 2, 2020", 1 pg.

"European Application Serial No. 19713599.9, Response to Communication pursuant to Rules 161(1) and 162 EPC filed Apr. 6, 2021", 17 pgs.

"European Application Serial No. 19717006.1, Response to Communication pursuant to Rules 161(1) and 162 EPC filed Apr. 1, 2021", 19 pgs.

Jennings, S. G, "The mean free path in air", Journal of Aerosol Science, 19(2):159, (1988), 159-166.

"Chinese Application Serial No. 201980025759.6, Office Action dated Feb. 3, 2023", W English Translation, 10 pgs.

"Chinese Application Serial No. 201980025761.3, Office Action dated Mar. 24, 23", w/English Translation, 18 pgs.

U.S. Appl. No. 16/278,705, filed Feb. 18, 2019, Apparatus and Method for Filtering.

* cited by examiner

APPARATUS AND METHODS FOR SELECTIVELY TRANSMITTING OBJECTS

This application claims the benefit under 35 U.S.C. § 119(e) of U.S. Provisional Application No. 62/710,602 filed on Feb. 17, 2018, and U.S. Provisional Application No. 62/710,341 filed on Feb. 15, 2018, each of which is incorporated by reference in its entirety.

FIELD

The invention relates to apparatus and methods for selectively transmitting objects of interest from a first reservoir to a second reservoir. The apparatus includes electromagnetic focusing apparatus configured to interact with objects of interest to induce a change in a property of the objects of interest so as to increase the probability that the objects of interest through a throat diffusively coupling the first reservoir and the second reservoir.

BACKGROUND

Selectively transmitting objects of interest across a membrane can be useful in applications such as filtering and generating thrust.

SUMMARY

According to the present invention, apparatus units for selectively transmitting objects of interest, wherein the apparatus unit comprise a bulk material; a throat disposed within the bulk material and extending from a first throat opening to a second throat opening opposite the first throat opening; and wherein the throat has length that is less than 1000 mean free path lengths of the objects of interest before interacting with the apparatus unit; and a first focusing apparatus, wherein the first focusing apparatus is disposed within the bulk material and in proximity to at least a portion of the throat.

According to the present invention, methods of selectively transmitting objects of interest from a first reservoir to a second reservoir, comprise providing the apparatus unit provided by the present disclosure, wherein the first throat opening is diffusively coupled to the first reservoir and the second throat opening diffusively coupled to the second reservoir; and generating a force field by activating the first focusing apparatus, to thereby selectively transmit objects of interest from the first reservoir to the second reservoir.

BRIEF DESCRIPTION OF THE DRAWINGS

The drawings described herein are for illustration purposes only. The drawings are not intended to limit the scope of the present disclosure.

DETAILED DESCRIPTION OF THE DRAWINGS

Figure 1:
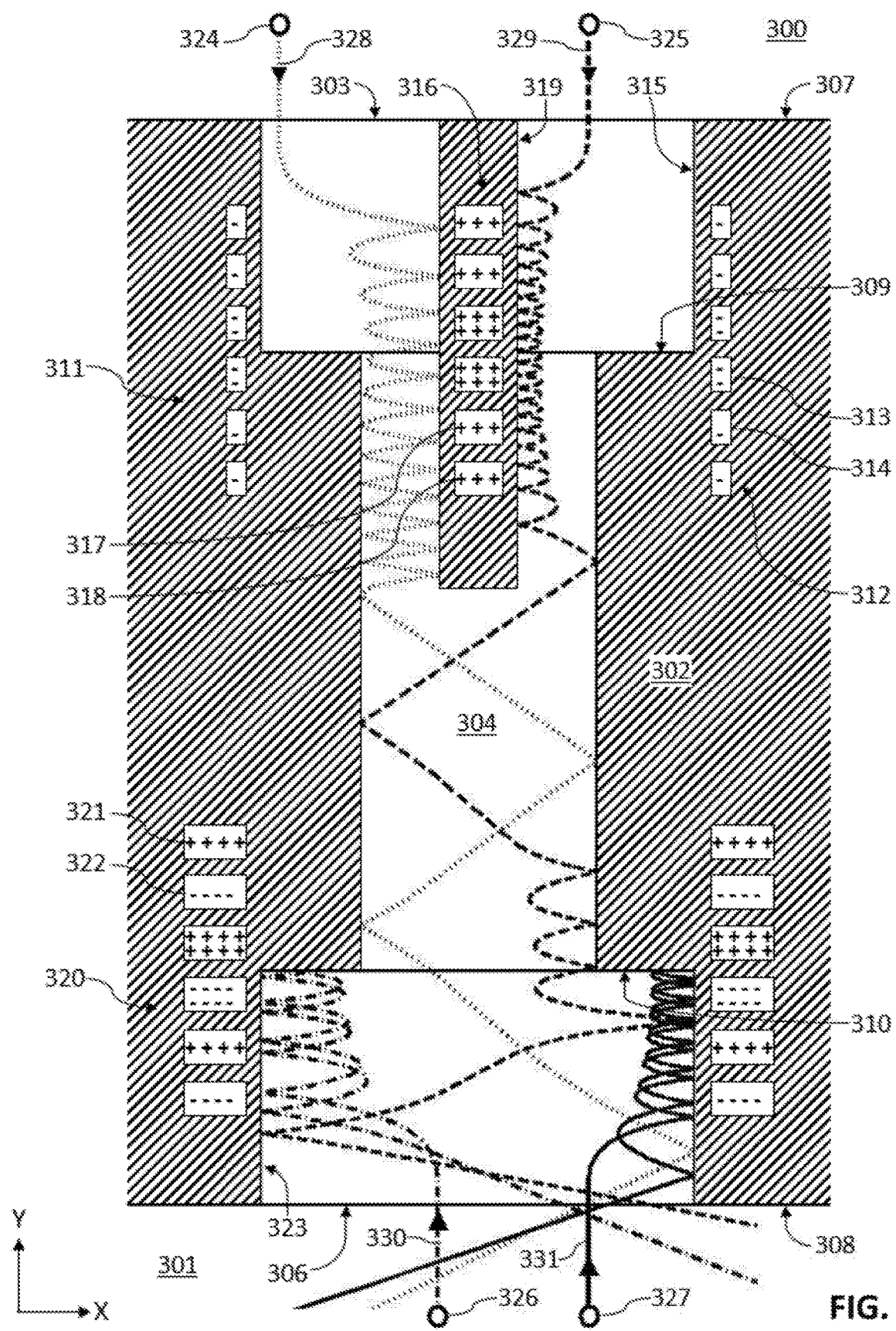
FIG. 1 shows a cross-sectional view of an apparatus according to the present invention.

Provided is an apparatus and method for filtering objects based on a defining property of the objects. The invention may be used for air purification, for example.

The term "medium" used herein describes any material which is capable of containing, carrying, transporting, or transferring an object of interest. A medium may be a gas, a liquid, a solid, or a vacuum, for example. By default, a medium refers to the collection of all objects which interact with a specified apparatus.

The term "object" used herein describes any component of a medium. An object may be described as a particle, such as a dust particle, a soot particle, a water droplet, a water molecule. An object may have a property of interest, as well as a defining property, which may be used to distinguish an object from other objects of the medium. The invention applies to any medium which can be considered to comprise distinct objects.

One can define a "default boundary condition" as a simplified scenario in which the properties of the medium at a first reservoir and a second reservoir are identical and uniform in time and space.

The "baseline scenario" is a scenario in which the filtering apparatus in question is replaced by a "baseline apparatus", defined as a solid, impenetrable, flat plate, and subjected to default boundary conditions.

One can define a "baseline probability" as the probability for any object which interacts with a baseline apparatus to be located at a specified side of the baseline apparatus after the interaction is completed in a baseline scenario. In this case, the baseline probability is 50% for both sides of the baseline apparatus.

Unless specified or clear from context, the term "or" is equivalent to "and/or" throughout this paper.

Apparatus and systems provided by the present disclosure are configured to interact with objects of interest in a medium so that the component of transmissivity of the objects of interest in a first direction is larger than the transmissivity of the objects of interest in a second direction. The medium can be a gas, a liquid, or a solid. The object of interest can be, for example, a photon, a phonon, an electron, an atom, a molecule, a particle, an aerosol, an electromagnetic wave, or a quasiparticle.

Transmissivity refers to the probability that an object of interest having a velocity in a specified range of directions after interacting with an apparatus or system provided by the present disclosure, where the objects of interest had a velocity with a direction outside the specified range of directions before interaction with an apparatus or system provided by the present disclosure. For example, the transmissivity of an object can refer to the probability that the objects of interest in a first reservoir pass through an apparatus or system provided by the present disclosure and into a second reservoir. The direction of transmissivity with respect to a surface of an apparatus can be at any angle. The transmissivity of an object of interest can be facilitated by the apparatus changing a property of the objects of interest before entering the apparatus at one or more bidirectional interfaces. The change in property can be induced by an electromagnetic field such as an electric field or a magnetic field. The bidirectional interfaces can define a channel through a bulk material. A property of interest can be a vector property of an object of interest and/or can be a number density of the objects of interest. For a vector property an apparatus can interact with the objects of interest to increase the probability or decrease the probability of the objects of interest will pass through the bidirectional interface. The apparatus can be configured such that the interaction can increase or decrease the number density of the objects of interest in a reservoir diffusively coupled to the bidirectional interface. The interaction can comprise focusing and/or defocusing trajectories of the objects of interest toward the bidirectional interface or away from the bidirectional interface. The average length of the path followed by an object of interest through the bidirectional interface can be on the order of the mean free path length of the object prior to interaction of the object with the apparatus.

FIG. 1 is a cross-sectional view of an embodiment of the invention.

In FIG. 1, the medium is schematically represented by individual particles, such as the schematic representation of particle 324. Each particle follows a trajectory in three-dimensional space. The 2D projection on the XY-plane of such a trajectory is also shown, such as in the form of trajectory 328. For simplicity, the medium can be considered to be a monatomic ideal gas. In other embodiments the object or particle may have any shape or spatial extent, including a shape that is not spherically symmetric, such as the shape of a dinitrogen molecule.

There is a first reservoir 300 and a second reservoir 301. The depicted apparatus has a first surface 307 and a second surface 308. In the configuration shown, the apparatus is stationary in the inertial XYZ-frame for simplicity in description and illustration.

A channel allows particles from the first reservoir 300 to pass through to the second reservoir 301. The portion of the channel between the first opening 303 and the first inside surface 309 is denoted the first channel. The portion of the channel between the second opening 306 and the second inside surface 310 is denoted the second channel. The first channel, the throat 304, and the second channel are collectively referred to as the "channel system". All have a circular cross-section when viewed along the Y-direction. In other embodiments, the channel may have any cross-section, such as square, rectangular, or polygonal cross-sections. All components of an apparatus of an embodiment which can be associated with a particular channel system are referred to as an "apparatus unit". An apparatus unit includes a first focusing apparatus 311, a second focusing apparatus 320, the channel system, as well as any bulk material 302 associated with the channel system. The interface between the channel associated with the first opening 303 and the throat 304 is denoted the first throat opening. The interface between the channel associated with the second opening 306 and the throat 304 is denoted the second throat opening. The channel system is enveloped by bulk material 302. The cross-sectional area of the throat 304 is smaller than the cross-sectional area of the first opening 303 and the cross-sectional area of the second opening 306.

In the case in which the objects of interest can be described as particles, such as molecules, bulk material 302 may be any solid material, such as a metal, ceramic, or composite. All accessible surfaces of material 302 are configured to perfectly reflect all objects of interest in the medium. In other embodiments, this need not be the case. Those skilled in the art will be able to choose an appropriate material for a given application.

There is a first focusing apparatus 311, which comprises an inside apparatus 316 and an outside apparatus 312. In the embodiment shown in FIG. 1, the particles are neutrally charged, but can be polarized by the application of an external electric field. A spatial gradient in said field can be used to apply an electrostatic force on the polarized particles. The first focusing apparatus 311 is configured to generate a first electric field which both polarizes and exerts forces on any particles of the medium in the proximity of the first focusing apparatus 311. One can define a radial direction, which is aligned with the outward normal of the cylindrical inner surface 319, and an axial direction, which is parallel to said surface, and the Y-axis. For example, the first electric field may be arranged as follows.

The magnitude of component of the electric field in the radial direction, or the "MCEFR", may be configured to decrease along the radial direction in the proximity of inner surface 319, and in a substantial portion of the volume of the first channel and in the proximity of the first throat opening of throat 304. Due to this radial variation of the MCEFR, the maximum value of the MCEFR of the first focusing apparatus 311 at a given location along the Y-axis within the first channel and throat 304 may be located on the inner surface 319.

The MCEFR at a given radius is also configured to, in general, increase to a maximum value as the position along the Y-axis is decreased from the first opening 303 onwards, where the maximum is located approximately half-way along the length of the first focusing apparatus 311, or approximately where the first throat opening is located, for instance. Note that said general increase refers to an increasing trend. The MCEFR at a given radius, such as the radius of the bulk material of inner surface 319, may vary, oscillate, or fluctuate about a general, increasing trend as the location along the Y-axis is decreased from the first opening 303 to the first throat opening, for example. These spatial fluctuations may arise from the manner in which the electric field is generated, as will be explained later. As the position along the Y-axis is decreased further, the MCEFR at a given radius is configured to decrease approximately symmetrically to the aforementioned increase, in this embodiment. Thus, the maximum MCEFR for all locations along the Y-axis within the first channel and throat 304 is located on the inner surface 319, at a location along the Y-axis approximately corresponding to the location of the first throat opening.

The magnitude of the circumferential component of the electric field associated with the first focusing apparatus 311 is zero in this embodiment. The magnitude of the axial component of the electric field associated with the first focusing apparatus 311 varies with the location along the Y-axis and with radius. The length of the first focusing apparatus 311 along the Y-direction, as well as the spatial or temporal form of the electric field associated with the first focusing apparatus 311 depends on the application and can be optimized using methods known in the art.

The effect of the radially decreasing MCEFR is the attraction of polarized particles to the inner surface 319 in the proximity of the first focusing apparatus.

Such a field can be generated in a multitude of ways. In this embodiment, the field is generated by an arrangement of charged material within bulk material 302. An inside apparatus 316 comprises a positively charged apparatus. In this embodiment, said apparatus comprises several electrically insulated collections of charge, such as charge collection 317 and charge collection 318, where each collection may contain a different charge compared to adjacent collections. In this way, a desired spatial distribution of electrical field strength can be generated. Each charge collection of inside apparatus 316 is cylindrical in shape in the configuration shown. In this embodiment, the field is constant in time. The electrical insulation may be facilitated by an appropriate choice of electrically insulating bulk material. In other embodiments, the charge collections may insulated by a separate material. An outside apparatus 312 comprises negatively charged apparatus, where the total negative charge balances the total positive charge of inside apparatus 316. In other embodiments, there may be a net charge associated with the first focusing apparatus 311.

As before, said apparatus comprises several electrically insulated collections of charge, such as charge collection 314 and charge collection 313, where each collection may contain a different charge compared to adjacent collections. In this simplified example each charge collection of outside apparatus 312 is in the shape of a ring which encompasses the first channel and throat 304. As a result of these charge collections of the first focusing apparatus 311, there are electric field lines which emanate from the cylindrical inside apparatus 316 and are directed towards the first outer surface 315, which is also cylindrical in shape albeit with a larger radius than cylindrical inner surface 319. This accounts for the radial features of the resulting electric field, which in turn account for a portion of the aforementioned decrease in MCEFR along the radial direction in this particular embodiment.

The second focusing apparatus 320 is configured to generate a second electric field which both polarizes and exerts forces on any particles of the medium in the proximity of the second focusing apparatus 320. As before, one can define a radial direction, which is aligned with the outward normal of the cylindrical second outer surface 323, and an axial direction, which is parallel to said surface, and the Y-axis. For example, the second electric field may be arranged as follows.

For at least some portions or sections of the channel system in proximity of the second focusing apparatus 320, such as in the proximity of the second outer surface 323 and other portions of the second channel, or in the throat 304 in the proximity of the second throat opening, the MCEFR may be configured to increase in the radially outward direction, where the radially outward direction is associated with the circular cross-section of the cylindrical second channel, for instance. In this embodiment, for a given location along the Y-axis, the MCEFR is configured to increase in the radially outward direction for all portions of the second channel, and the portion of the throat 304 which is in proximity of the second focusing apparatus 320. For a given location along the Y-axis, the MCEFR reaches a maximum on the second outer surface 323 in the second channel and on the outer surface of the aforementioned portion of throat 304, and is increasing in the radial direction within said portions of the channel system.

The MCEFR at a given radius is also configured to, in general, increase to a maximum value as the position along the Y-axis is increased from the second opening 306 onwards, where the maximum is located approximately half-way along the length of the second focusing apparatus 320, or approximately where the second throat opening is located, for instance. As before, said general increase refers to an increasing trend. The MCEFR at a given radius, such as the radius describing the location of the second outer surface 323, may vary, oscillate, or fluctuate about a general, increasing trend as the location along the Y-axis is increased from the second opening 306 to the second throat opening, for example. These spatial fluctuations may arise from the manner in which the electric field is generated, as will be explained later. As the position along the Y-axis is increased further, the MCEFR at a given radius is configured to decrease approximately symmetrically to the aforementioned increase, in this embodiment. Thus, the maximum MCEFR for all locations along the Y-axis within the second channel and throat 304 is located on the second outer surface 323, at a location along the Y-axis approximately corresponding to the location of the second throat opening.

The magnitude of the circumferential component of the electric field associated with the second focusing apparatus 320 is zero in this embodiment. The magnitude of the axial component of the electric field associated with the second focusing apparatus 320 varies with the location along the Y-axis and with radius. The length of the second focusing apparatus 320 along the Y-direction, as well as the spatial or temporal form of the electric field associated with the second focusing apparatus 320 depends on the application and can be optimized using methods known in the art.

The effect of the radially increasing MCEFR is the attraction of polarized particles to the second outer surface 323, and to the outer surface of throat 304 in the proximity of the second focusing apparatus 320.

Such a field can be generated in a multitude of ways. In this embodiment, the field is generated by an arrangement of positively and negatively charged material within bulk material 302. In this embodiment, said apparatus comprises several electrically insulated collections of charge, such as charge collection 321 and charge collection 322, where each collection may contain a different amount of charge compared to adjacent collections. In this way, a desired spatial distribution of electrical field strength can be generated. In this simplified example each charge collection of the second focusing apparatus 320 is in the shape of a ring which encompasses the second channel and throat 304. In this embodiment, the field is constant in time. The electrical insulation may be facilitated in a similar manner as described in the context of first focusing apparatus 311. The net charge of the second focusing apparatus 320 is zero. In other embodiments, there may be a net charge associated with the second focusing apparatus 320. There are concentrations of electric field lines which emanate from localized areas of second outer surface 323 in the proximity of the charge collections of the second focusing apparatus 320. This non-uniform concentration of electric field lines accounts for the aforementioned increase in MCEFR along the radially outward direction in this particular embodiment.

In other embodiments, the collections of charge of the second focusing apparatus 320 may not form aforementioned rings, but may be discretized in the circumferential direction, as well. Thus, the electric field lines can be concentrated in the circumferential as well as the axial direction, leading to regions or sections of the channel system with a more strongly increasing MCEFR in the radially outward direction towards the second outer surface 323 and towards the outer surface of throat 304 in the proximity of the second focusing apparatus 320. In some embodiments, such concentrations of electric field lines can be generated by individual atoms or molecules of the second focusing apparatus 320. In this case the interaction between the particles of the medium and the second focusing apparatus 320 can be described as a dipole-dipole interaction, or a van der Waals interaction, as opposed to a dipole-charge interaction shown in FIG. 1. In other embodiments, aforementioned adjacent rings in FIG. 1 need not have an opposite charge, but can have a similar charge. This also applies to any discrete collections of charge associated with a focusing apparatus.

The collections of charge may be comprised of conducting material, such as copper, which may be electrically connected to a source of electric potential, such as a battery terminal. In other embodiments, the collections of charge are generated by the embedding of ions in an electrically insulating or semiconducting host material, such as bulk material 302. Such methods are well known in the art.

In other embodiments, the strength of the electric field can be regulated over time in order to control the interaction of the apparatus with the medium. An appropriate electric field distribution in time and space can be determined using methods known in the art.

In other embodiments the objects may have a permanent dipole, such as is the case for water molecules. The objects may also carry a permanent charge, such as an ion, or an electron. In this case, the first and second focusing apparatuses may use the electric field instead of the gradient of the electric field in order to deflect the objects. In this case the interaction between a focusing apparatus and an object may be described as a charge-charge interaction. Alternatively, a magnetic field can be used to focus the trajectories of such objects. Such methods are well known in the art, such as in the context of electron microscopes.

In general terms, one can describe the purpose of the first and second focusing apparatuses to be the generation of a force field. A force field is a vector field which defines the magnitude and direction which an object of interest would experience at a specified location at a specified time. An "object of interest" is the object which the apparatus of the invention is intended to interact with in the aforementioned manner. For example, within a conductor, such as a metal, the free or conducting electrons may be objects of interest, while the lattice atoms, or the bound electrons and nuclei, are other objects of the medium surrounding the apparatus. Note that the force field can vary in time and space, and may also be a function of the properties of a specified object at the specified point in space and time. For example, in the case in which the forces of the force field arise from the interaction of a charged particle with a magnetic field, the force at a specified location and time is also a function of the velocity of said particle. In accordance with some embodiments of the invention, the force field of a focusing apparatus is configured to modify the position, e.g. by deflecting, or to modify the shape of objects, through the action of attraction or repulsion by a force field generating apparatus, in a manner in which the uniformity of a medium in time or space, in the case of a default boundary condition, is disturbed by an extent which exceeds any expected, microscopic fluctuations of said medium. Note that an aforementioned force field may interact with or exert forces on an object in a manner in which moments or torques are acting about the center of mass of an object. The term "force field" therefore also encompasses any field which can be considered to be a torque or moment field. The force field may in some embodiments also be described or expressed in terms of a potential field. Examples of repulsion are the electrostatic repulsion between like charges and the reflection of photons by a mirror, or particles by a surface. Examples of attraction are the gravitational force, the van der Waals force, the electrostatic attraction between unlike charges, or the interaction between an electric field gradient generating apparatus and an electrically polarized particle. These disturbances need not involve a change in the average energy of an object. In some embodiments, or some applications, the average energy of an object may change throughout an interaction, where the change nevertheless provides an improvement on the prior art, as measured by an objective function.

These artificial disturbances can be configured to increase or decrease a property of interest of objects of a specified defining property at a specified interface between a first and second reservoir, where the interface may be the second throat opening, where the defining property may be the location of the object of interest in a first or second reservoir prior to interacting with an apparatus of the invention, where the property of interest may be the number of objects per unit volume, and where the increase or decrease is measured relative to the corresponding properties of the medium for a baseline scenario. For example, a first focusing apparatus may be configured to artificially increase the density of objects originating at a first reservoir at the second throat opening, where the density increase refers to a density which is, on average, larger than the density of objects of the medium in the first reservoir for a baseline scenario. In some embodiments, an additional second focusing apparatus may be configured to artificially decrease the density of objects originating at a second reservoir at the second throat opening, where the density decrease refers to a density which is, on average, lower than the density of objects of the medium in the second reservoir for a baseline scenario. As a result there may be a net diffusion of a property of interest from a first reservoir 300 to a second reservoir 301.

In other embodiments, the first and second focusing apparatus generate the aforementioned force field in a different manner. For example, the forces may originate from van der Waals interactions between objects of a focusing apparatus and objects of the medium. For example, the inner surface 319 or the second outer surface 323 may be constructed of material with a non-zero force interaction, van der Waals or otherwise, with objects of the medium. The first surface 307 may also be constructed of the same material in order to enhance the focusing effect. To that end, the first surface 307 may furthermore be configured to guide objects of the medium to the first opening 303. The outward normal of the first surface 307 associated with a first channel may have a radially inward component, for example. The aforementioned non-zero force interaction can deflect or adsorb objects of the medium, after which these objects may diffuse along the surface. In the case of the inner surface 319, these objects may, after having been adsorbed or deflected by said force interaction, diffuse through the first throat opening, thus achieving an intended focusing effect. Once within the throat, these objects may desorb or escape the force field of the inner surface 319 and the first focusing apparatus 311. The geometry of the throat may furthermore be configured in such a way, that, on average, a sufficient fraction of these objects subsequently diffuse to the second throat opening, where sufficiency may be determined by an objective or intended purpose of the apparatus. For example, the normal of the inside surface of the throat may have a component in the negative Y-direction throughout the throat 304, or at a suitable location in the throat 304. The first outer surface 315 may have a negligible or comparatively smaller such van der Waals interaction in some embodiments in order to enhance the focusing effect of the first focusing apparatus. The inside surface of the throat, as well as any reflective surfaces, such as second inside surface 310 and second surface 308 may also have a negligible or smaller such interaction in order to facilitate the diffusion or reflection of objects of the medium. The appropriate material selection for different surfaces, as well as a suitable geometry and arrangement of such surfaces, depends on the application and can be found by those skilled in the art.

In the context of the simplified embodiment in FIG. 1, one can define an interaction between a particle and the depicted apparatus to commence when a particle passes through, intersects, or comes into contact with, planes containing the first surface 307 or the second surface 308, where the planes are parallel to the XZ-plane, and where the direction of travel prior to the interaction is in the opposite direction of the outward normal of the associated surface of the bulk material, which is directed in the positive Y-direction for the first surface 307, and the negative Y-direction for the second surface 308. These planes are denoted the first plane, and the second plane, respectively. An interaction can be defined to end when a particle no longer intersects or is in contact with the aforementioned planes. Said "contact" can in this case be defined as the existence of a non-negligible force between an object of the medium and an object of the apparatus, such as an object of bulk material 302.

One can define "input properties of interest" and "output properties of interest" as the properties of interest of a specified class of objects immediately before and immediately after interacting in a non-negligible manner with an embodiment of the invention, respectively. A property of interest may be the location of an object in either the first reservoir 300 or the second reservoir 301. The interaction of an object of interest with the apparatus of the invention can be described in terms of the difference between the input and output properties of interest. For example, an interaction can be described as either a transmission from the one reservoir to another reservoir, or a reflection back into the reservoir the object was located in before the interaction began. By definition, the type of interaction is a function of the "defining properties" of an object. The set of defining properties of the objects of interest may comprise the properties which distinguish the object of interest from other objects of the surrounding medium. In the embodiment shown in FIG. 1, the set of defining properties of an object also includes the input property of interest, i.e. the location of an object in either the first reservoir 300 or the second reservoir 301 immediately before interacting in a non-negligible manner with an embodiment of the invention. Throughout an interaction, an apparatus configured and operated in accordance with the invention will distinguish between or filter objects based on the value of the defining property of an object. In other words, the expected value of the type of interaction between a specified class of objects with at least one specified defining property and an embodiment of the invention is not equal to the expected value of the type of interaction of objects of the same specified class but different specified defining property. The expected value is the statistical expectation calculated for all objects contained within at least one specified class of objects which interact with an embodiment of the invention in a sufficiently long duration of time to provide a sufficiently accurate result. By default, a class of objects comprises all objects which interact with a specified apparatus.

In the context of this generation of embodiments, an embodiment of the invention is configured to focus objects originating at a first reservoir 300 before they arrive at an interface to the second reservoir 301, such as a second throat opening. The focusing or collection of objects is facilitated by a first focusing apparatus 311. In this way, the probability of an object arriving at the second throat opening to have originated at the first reservoir 300 is increased beyond the baseline probability of 50%. The embodiment shown in FIG. 1 is also configured to focus and reflect objects originating at a second reservoir 301 before they arrive at an interface to the first reservoir 300, such as the second throat opening. The focusing of objects is facilitated by a second focusing apparatus 320, while the reflection is accomplished by a second inside surface 310. From the perspective of the second throat opening, the second focusing apparatus 320 can be considered to defocus objects originating at a second reservoir 301. In this way, the probability of an object arriving at the second throat opening to have originated at the second reservoir 301 is decreased below the baseline probability of 50%.

As a result there may be a net diffusion of a property of interest from a first reservoir 300 to a second reservoir 301. In other embodiments, other such focusing mechanisms may be used. There are a wide variety of such methods known in the art for any given application. Once the default boundary condition is removed, and the first and second reservoirs are assumed to be finite in size and otherwise isolated from each other and any other reservoirs, the concentration of objects of interest in the first reservoir could be reduced over time, while the concentration of objects in the second reservoir could be increased correspondingly. Embodiments of the invention can thus also be considered for pumping applications. Connecting several stages of the apparatus shown in FIG. 1 in series, i.e. allowing the second reservoir of a first apparatus to coincide with the first reservoir of a second apparatus, could achieve a desired steady-state concentration of objects of interest in a first reservoir 300.

In this particular embodiment, the aforementioned focusing is accomplished by the increasing and decreasing MCEFR in a radial direction. For example, for the first focusing apparatus 311, the MCEFR decreases the radial direction, resulting in a polarization of particles of the medium in the proximity of cylindrical inner surface 319, and the attraction of these polarized particles to said surface. Consider the trajectory 328 of particle 324, which has a non-zero velocity component in the negative Y-direction and is located in the first reservoir 300 preceding the interaction with the depicted apparatus. As the particle enters the electric field of the first focusing apparatus 311, it is polarized and, due to the radial gradient of the MCEFR, attracted to inner surface 319. Since bulk material 302 is perfectly reflective in this simplified example, the particle will reflected from said surface. The attraction and reflection may repeat several times, in the form of bounces. The increasing MCEFR for a given radius in the negative Y-direction in the first channel results in a larger radially inward force experienced by a particle due to an increasing magnitude of the polarization of a particle and an increasing radial gradient of the MCEFR, for example. Hence the amplitude of the ensuing bounces decreases as the location of the particle along the Y-axis decreases. In the case of trajectory 328, the peak amplitude of the bounces at the location of the first throat opening is small enough for particle 324 to diffuse into throat 304. Once inside throat 304, the particle may continue to diffuse in the negative Y-direction, resulting in a departure from the force field of first focusing apparatus 311 and a passage through the second throat opening and the second channel into the second reservoir 301. Particle 324 is only temporarily affected by the second focusing apparatus 320 in that process. Trajectory 329 of particle 325 shows a similar interaction. Particle 326 has a non-zero velocity component in the positive Y-direction and is located in the second reservoir 301 preceding the interaction with the depicted apparatus. As indicated by trajectory 330, as particle 326 enters the electric field of the second focusing apparatus 320, it is polarized and, due to the radial gradient of the MCEFR, attracted to second outer surface 323, from where it is subsequently reflected. The amplitude of the ensuing bounces decreases owing to the larger radially outward force experienced by particle 326 due to the increasing MCEFR for a given radius in the positive Y-direction in the second channel. The amplitude of a bounce is sufficiently small at the location of the second throat opening, that particle 326 is reflected by second inside surface 310 instead of diffusing into throat 304. Subsequently particle 326 diffuses back into the second reservoir 301. Trajectory 331 of particle 327 shows a similar interaction. Note that the XY-plane projection of the initial velocities of particles 324, 325, 326, and 327 are parallel to the Y-axis for clarity of illustration only. The velocity of other particles diffusing into and out of the first opening 303 or the second opening 306 can take any direction and magnitude also found in the medium of the respective reservoir 301 and consistent with the direction of said diffusion. Note that some particles which originate at the first reservoir 300 will return to the first reservoir 300 once the interaction is complete. Similarly, some particles which originate at the second reservoir 301 will be found at the first reservoir 300 once the interaction is complete. On average, however, the apparatus is configured in such a manner, that there is a net diffusion of particles from the first reservoir 300 to the second reservoir 301 throughout an interaction for the default boundary condition.

One can define a first capture surface as the surface describing the first opening 303, and the second capture surface as the surface describing the second opening 306, where first and second capture surfaces are parallel to the XZ-plane. In this embodiment, the associated first capture area is smaller than the second capture area. One can define a "first footprint surface" to be the total surface that forms an interface to the first reservoir 300 and is associated with an apparatus unit, i.e. the sum of the first capture surface and any portion of the first surface 307 associated with an apparatus unit. The boundary of the footprint surface of an apparatus unit is provided by the boundary of other footprint surfaces of adjacent apparatus units, where the apparatus units are, at least hypothetically, arranged periodically in the XZ-plane. For example, the boundary of a first footprint surface may have a hexagonal shape. Similarly, one can define a "second footprint surface" as the projection of the first footprint surface on the second surface 308. One can define a control volume which is bounded by the first footprint surface, the second footprint surface, as well as the surface parallel to the Y-axis connecting corresponding points of the first and second surface of the control volume. For the default boundary condition, the probability of an object of the medium being located in the first reservoir 300 prior to interacting with the first or second footprint surface is 50%, with the other 50% applying to the second reservoir 301. Since the first capture area is smaller than the second capture area, the probability of a particle entering the channel system from the first reservoir 300 is smaller than the probability of a particle entering the channel system from the second reservoir 301. The fraction of particles which enter the channel system via the first opening 303 and exit via the second opening 306 is denoted the "first transmissivity". The fraction of particles which enter the channel system via the second opening 306 and exit via the first opening 303 is denoted the "second transmissivity". For the default boundary condition, there will be a net flow rate of objects from the first reservoir 300 to the second reservoir 301 when the net diffusivity is greater than one, where the net diffusivity is calculated by multiplying the ratio of the first and second transmissivity by the ratio of the first and second capture area. In the embodiment shown, the first focusing apparatus 311 and the second focusing apparatus 320 are configured to ensure that the ratio of the first transmissivity to the second transmissivity is larger than one and large enough to compensate for a ratio of the first capture area to the second capture area which is smaller than one, such that the net diffusivity is greater than one. The geometry of the channel system, the configuration of the focusing apparatuses, and the ratio of the first capture area to the second capture area are examples of parameters that can be optimized by those skilled in the art in order to maximize an objective subject to constraints. The objective may be the net flow rate of a property of interest from the first reservoir 300 to the second reservoir 301.

The effectiveness of the depicted apparatus may be a function of the geometry and the scale, or the size, of the apparatus. The height of the depicted apparatus is defined to be the dimension of the apparatus along the Y-axis, i.e. the shortest distance between the first surface 307 and the second surface 308. It may be desirable to avoid excessive scattering amongst objects of interest, scattering between objects of interest and other objects of a medium, as well as any diffuse reflection by the walls within the channel system. Although such scattering behavior can be taken into account and, at least partially, compensated for in the configuration of the apparatus, it may degrade the intended performance of the apparatus, by reducing the first transmissivity or increasing the second transmissivity, for instance. In the absence of scattering, the initially necessarily negative Y-velocity component of a particle entering the channel system from the first reservoir 300, for example, is more likely to be maintained, which would enhance any desired focusing effects and first transmissivity. Other types of scattering may also apply to other embodiments of the invention.

There are several approaches for reducing such scattering. For example, the apparatus can be configured to reduce the expected number of reflections of objects by any reflective surfaces of an apparatus in order to reduce any reductions in transmissivity associated with diffuse reflections. The apparatus may also be configured to be of a small size in order to minimize the probability of scattering between objects of interest and other objects of a medium. In some embodiments it may also be possible to artificially exclude, filter, or remove such other objects of the medium from a channel system, while allowing a sufficient portion of objects of interest to interact with the channel system as intended. To maintain a high first transmissivity despite scattering amongst objects of interest, it may be desirable for the height of the apparatus to be smaller than a length several orders of magnitude larger than the mean free path of an object of interest in the medium for a default boundary condition, for example. In some embodiments, it may even be preferable for the height of the apparatus to be a fraction of the mean free path, where a fraction means less than one. The characteristic width of a channel, such as the diameter of the throat 304 is subject to similar considerations. The width may also be within several orders of magnitude of the mean free path of an object of interest in the medium, for example. The width may also be a fraction of the mean free path, depending on the application and the properties of the medium. Note that in some cases, it may be possible and desirable to configure a medium in a way in which the objects of interest have a suitable mean free path length. Amongst other factors, suitability may be determined by the relation between the tolerances of a specified manufacturing method and the required size and shape resolution of an apparatus of the invention. The appropriate material, geometry, and method of manufacture can be found by those skilled in the art. Note that such size considerations apply to all embodiments of the invention, even though they may have a negligible effect for some applications.

An apparatus unit for selectively transmitting objects of interest provided by the present disclosure can comprise a bulk material; a throat disposed within the bulk material and extending from a first throat opening to a second throat opening opposite the first throat opening; and wherein the throat has length that is less than 1000 mean free path lengths of the objects of interest before interacting with the apparatus unit; and a first focusing apparatus, wherein the first focusing apparatus is disposed within the bulk material and in proximity to at least a portion of the throat.

The throat can have a length, for example, that is less than 1000 mean free path lengths of the objects of interest before interacting with the apparatus unit, less than 500 mean free path lengths, less than 250 mean free path lengths, less than 100 mean free path lengths, less than 10 mean free path lengths or less than 1 mean free path length. The throat can have a length, for example, from 0.1 mean free path lengths to 1000 mean free path lengths of the objects of interest before interacting with the apparatus unit, from 1 to 500, or from 10 mean free path lengths to 250 mean free path lengths.

The throat can have a width, for example, that is less than 1000 mean free path lengths of the objects of interest before interacting with the apparatus unit, less than 500 mean free path lengths, less than 250 mean free path lengths, less than 100 mean free path lengths, less than 10 mean free path lengths or less than 1 mean free path length. The throat can have a width, for example, from 0.1 mean free path lengths to 1000 mean free path lengths of the objects of interest before interacting with the apparatus unit, from 1 to 500, or from 10 mean free path lengths to 250 mean free path lengths.

The bulk material can comprise a first surface and a second surface opposite the first surface and the throat can extend from the first bulk material surface to the second bulk material surface. The throat can have a constant dimension throughout its length or can have sections with different dimensions throughout its length. For example, the throat can comprise a first channel at the first bulk material surface and/or a second channel toward the second bulk material surface and a narrow section coupling the first and second channels. A throat can comprise a first channel disposed within the bulk material and extending from a first opening to the first throat opening opposite the first opening and/or a second channel disposed within the bulk material extending from the second throat opening to a second opening.

The multiple sections of the throat can be co-aligned along a common linear or non-linear axis. The multiple sections can be asymmetrically situated with respect to a common axis.

A throat can have any suitable shape, which can vary throughout the length of the throat. For example, a throat or sections of a throat can have a circular, oval, rectangular, square, polygonal, or other suitable cross-sectional shape.

A focusing apparatus can be disposed within the bulk material in proximity to the throat. A focusing apparatus can be disposed in proximity to the first throat opening, in proximity to the second throat opening, and/or toward the middle of the throat. An apparatus unit can comprise one or more focusing apparatus.

A focusing apparatus can be configured to generate an electromagnetic field. The electromagnetic field can interact with objects of interest outside of the apparatus unit to increase the probability that the objects of interest will pass through the throat from one side of the apparatus unit to the other side. For example, an apparatus unit can separate a first reservoir from a second reservoir which are diffusively coupled through the throat. The electromagnetic field generated by the one or more focusing apparatus can interact with the objects of interest within the first and/or second reservoirs.

A focusing apparatus can comprise one or more charge collections and/or one or more magnetic dipoles disposed within the bulk material and in proximity to the throat such as, for example, in proximity to the first throat opening and/or the second throat opening.

The focusing apparatus can be configured to generate an electromagnetic field magnitude gradient. For example, an electromagnetic field magnitude gradient can increase toward a throat opening or can decrease toward a throat opening. An electromagnetic field magnitude gradient can increase toward the center of the focusing apparatus or decrease toward the center of the focusing apparatus. Other electromagnetic field magnitude gradients are possible.

A focusing apparatus can be in the shape of an annular ring that surrounds at least a portion of a throat. A focusing apparatus can comprise segments of an annular ring. A focusing apparatus can comprise, for example, a rectangular plate or a section of cylinder.

A focusing apparatus can comprise an inside focusing apparatus and/or an outside focusing apparatus. An inside focusing apparatus refers to an element that is disposed within at least a portion of the throat and includes elements such as one or more charge collections or dipole collections configured to generate an electromagnetic field. The electromagnetic field can be, for example, an electric field or a magnetic field. An outside focusing apparatus can be disposed within the bulk material an in alignment with at least a portion of the inside focusing apparatus. An outside focusing apparatus can comprise one or more charge collections or dipole collections.

Each of the one or more charge and dipole collections can be insulated from the bulk material.

A charge collection can be an electrically conductive material and can be electrically interconnected to a potential. A charge collection can comprise embedded electrons and/or ions in an electrically insulating or semiconducting material.

A dipole collection can comprise a magnetic material.

A focusing apparatus can be disposed in proximity to the first throat opening and/or the second throat opening and can be configured to pull objects of interest toward the bulk material in proximity to the first throat opening.

A focusing apparatus can be disposed in proximity to the first throat opening and/or the second throat opening and can be configured to repel objects of interest away from the bulk material in proximity to the first throat opening.

A bulk material can comprise a metal, a metal alloy, a ceramic, a composite, a thermoplastic, a thermoset, a semiconducting material, electrically insulating material, a semiconducting material, an electrically insulating material, a glass, or a combination of any of the foregoing. Inner surfaces of the bulk material forming the throat can be configured to reflect at lest a portion of the objects of interest.

Objects of interest can comprise, for example, electrically charged objects of interest can include electrons, ions or charged dust particles or aerosols, or permanent or induced electric dipoles, atoms, or molecules or permanent or induced magnetic dipoles, or combinations of any of the foregoing.

Objects of interest can be polarized, can comprise a permanent charge, or can be neutral.

The apparatus unit is configured to change a property of objects of interest in proximity to the first throat opening and/or the second throat opening. The change in property can be induced by interaction of the objects of interest with the one or more focusing apparatus.

A property can be, for example, the number density of the objects of interest at the first throat opening and/or the second throat opening.

A property is a vector property of the objects of interest at the first throat opening and/or the second throat opening. Vector properties can be associated with objects of interest such as photons, electrons, objects having a permanent or induced electric dipole, objects having a permanent or induced magnetic dipole, objects having as a polarization axis, or a combination of any of the foregoing. Changing a vector property can comprise, for example, changing the orientation of the objects of interest with respect to the geometry of the first throat opening and/or the second throat opening.

As a result of interacting with electromagnetic fields generated by the one or more focusing apparatus, the objects of interest comprise a first property before entering the throat from a first direction; and the objects of interest comprise a second property before entering the throat from a second direction. wherein the first property is different than the second property.

An apparatus unit can be disposed such that the first throat opening is diffusively coupled to a first reservoir with respect to the objects of interest of interest; and the second throat is diffusively coupled to a second reservoir with respect to the objects of interest of interest. Each of the first reservoir and the second reservoir independently can comprise an electromagnetic field. For example, a first reservoir can comprise a first reservoir focusing/defocusing apparatus within the first reservoir and in proximity to the first throat opening; and/or a second reservoir can comprise a second reservoir focusing/defocusing apparatus within the second reservoir and in proximity to the second throat opening. Each of the first reservoir and second reservoir focusing/defocusing apparatus can be independently configured to focus a trajectory of the objects of interest from a reflection trajectory to a transmission trajectory. Each of the first reservoir and second reservoir focusing/defocusing apparatus can be independently configured to change a trajectory of the objects of interest in the first reservoir and/or the second reservoir prior to interaction with the apparatus unit. Changing the trajectory can comprise changing the trajectory from a reflection trajectory to a transmission trajectory or changing the trajectory from a transmission trajectory to a reflection trajectory.

Systems provided by the present disclosure can comprise two or more of the apparatus units provided by the present disclosure, such as greater than 10 apparatus units, greater than 100, greater than 1,000, greater than 10,000, greater than 100,000, greater than 1,000,00, greater than 10,000,000, or greater than 100,000,000 apparatus units. The apparatus units can form a planar array of apparatus submits. A system can comprise planar arrays of apparatus units disposed next to each other within the same plane and/or can be disposed in a direction normal to another planar array. Apparatus units and planar arrays comprising apparatus units can be couple in series. For example, a second throat opening of a first apparatus unit is diffusively coupled to a first throat opening of a second apparatus unit.

Methods of selectively transmitting objects of interest from a first reservoir to a second reservoir provided by the present disclosure can comprise providing the apparatus unit provided by the present disclosure, wherein the first throat opening is diffusively coupled to the first reservoir and the second throat opening diffusively coupled to the second reservoir; and generating a force field by activating the first focusing apparatus, to thereby selectively transmit objects of interest from the first reservoir to the second reservoir.

Provided is an apparatus and method for filtering objects based on a defining property of the objects. The invention may be used for air purification, for example.

Figure 2:
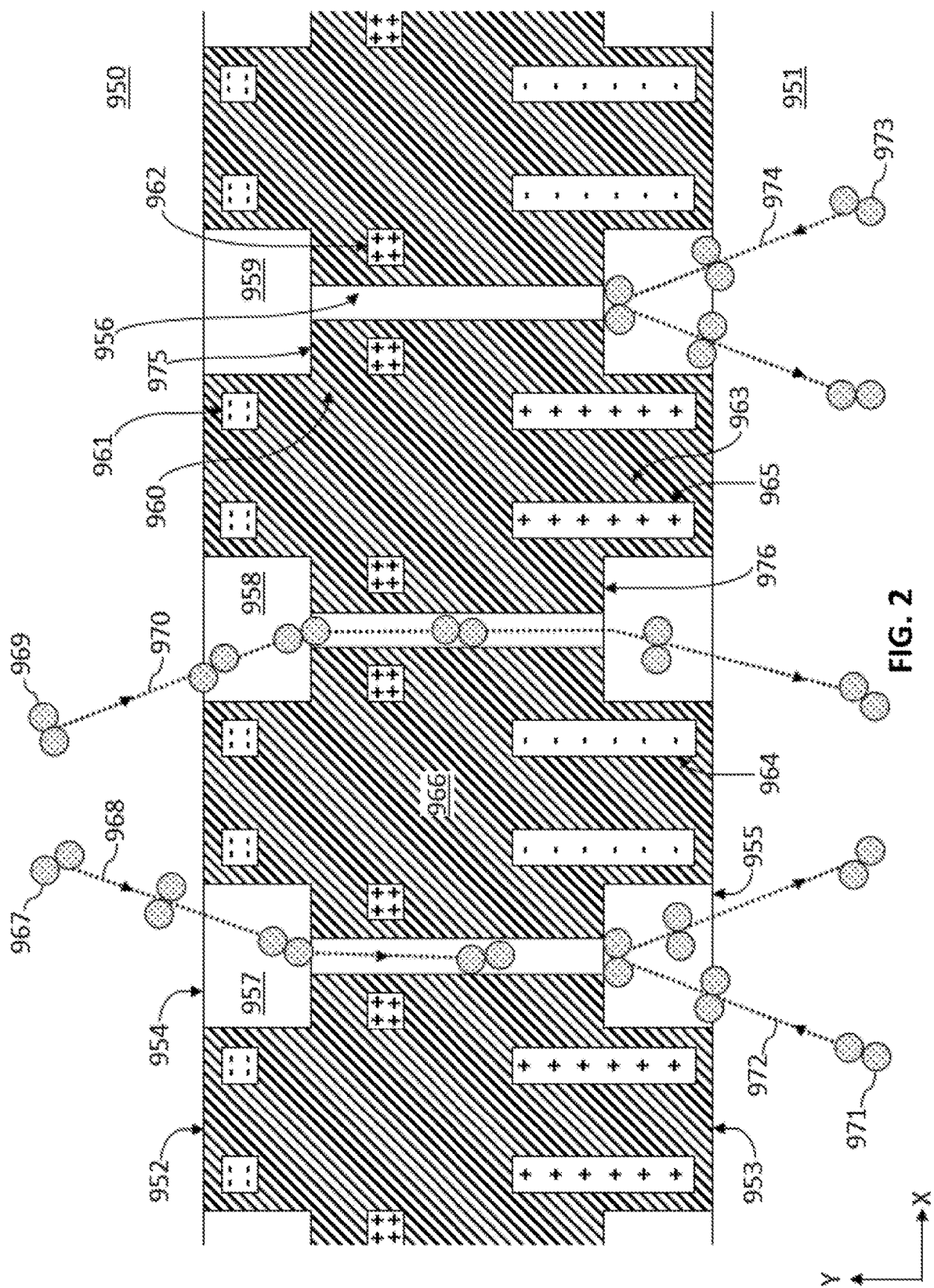
FIG. 2 shows a cross-sectional view of an apparatus according to the present invention.

In FIG. 2, the medium is schematically represented by individual particles, such as the schematic representation of particle 967. Each particle follows a trajectory in three-dimensional space. The 2D projection on the XY-plane of such a trajectory is also shown, such as in the form of trajectory 968. For simplicity, the medium can be considered to be an ideal gas comprising diatomic molecules, such as particle 967. In other embodiments the object or particle may have any shape or spatial extent, including a shape that is nominally spherically symmetric, such as the shape of a hydrogen atom.

There is a first reservoir 950 and a second reservoir 951. The depicted apparatus has a first surface 952 and a second surface 953.

A channel allows particles from the first reservoir 950 to pass through to the second reservoir 951. The portion of the channel between the first opening, such as first opening 954, and a first inside surface, such as first inside surface 975, is denoted the first channel. The portion of the channel between a second opening, such as second opening 955, and a second inside surface, such as second inside surface 976, is denoted the second channel. The first channel, the throat 956, and the second channel are collectively referred to as the "channel system", such as channel system 957, channel system 958, or channel system 959. The cross-section of the first channel and throat 956 is circular, while the cross-section of the second channel is square, where the normal of at least one face is aligned with the X-axis, and at least one face is coincident with a second inside surface, such as second inside surface 976. In other embodiments, the second channel may have a circular cross-section as well. Any channel may have any cross-section, such as square, rectangular, or polygonal cross-sections. All components of an apparatus of an embodiment which can be associated with a particular channel system are referred to as an "apparatus unit". An apparatus unit includes a first alignment apparatus 960, a second alignment apparatus 963, the channel system, as well as any bulk material 966 associated with the channel system. The interface between the first channel and the throat 956 is denoted the first throat opening. The interface between the second channel and the throat 956 is denoted the second throat opening. The channel system is enveloped by bulk material 966. The cross-sectional area of the throat 956 is smaller than the cross-sectional area of the first opening 954 and the cross-sectional area of the second opening 955. In this embodiment, the cross-sectional area of the throat 956 is larger than the smallest cross-sectional area of a particle, but smaller than the largest cross-sectional area a particle may assume during an interaction with the depicted apparatus.

In the case in which the objects of interest can be described as particles, such as molecules, bulk material 966 may be any solid material, such as a metal, ceramic, or composite. All accessible surfaces of material 966 are configured to perfectly reflect all objects of interest in the medium. In other embodiments, this need not be the case. Those skilled in the art will be able to choose an appropriate material for a given application.

There is a first alignment apparatus 960, which comprises a first collection of charge 962 and a second collection of charge 961.

In the embodiment shown in FIG. 2, particles such as particle 967, are neutrally charged, but can be polarized by the application of an external electric field. In FIG. 2, there is furthermore a unique first principal polarization axis, or "FPPA", associated with the polarizability tensor. The FPPA is defined to be parallel to the eigenvector corresponding to the largest eigenvalue of the polarizability tensor. In this case, when an applied, uniform electric field is not parallel to the instantaneous FPPA of a particle, the axis of polarization of a particle will not be aligned with the applied electric field. This results in a moment or torque, which acts to align the FPPA of a particle with the electric field. For example, when a stationary dipole is not aligned with a uniform electric field, the orientation of the dipole will oscillate about the orientation of the electric field due to the moment experienced by the dipole. Due to this oscillation, the particle will radiate energy in the form of electromagnetic radiation, which acts to dampen the magnitude of the oscillation. Once a sufficient amount of time has passed a sufficient amount of energy has been dissipated, a new equilibrium orientation, in which the dipole is aligned with the electric field, is reached. In FIG. 2, the FPPA is parallel to the long axis of the diatomic molecule, i.e. the axis formed by the line containing the centers of the nuclei of both atoms.

The first alignment apparatus 960 is configured to generate a first electric field which can both polarize and, under certain conditions, also exert forces and moments on any particles of the medium in the proximity of the first alignment apparatus 960. One can define a radial direction, which is aligned with the outward normal of the cylindrical inner surface of the first channel, and an axial direction, which is parallel to said surface and the Y-axis. For example, the first electric field may be arranged as follows.

The electric field within the first channel and a portion of the first throat opening is substantially aligned with the axial direction, i.e. the Y-axis, or the length of the throat 956. The effect of the field is an increased probability of an alignment of the FPPA of particles along the axial direction. This corresponds to the alignment of the long axis of a molecule with the Y-axis in the first channel and the first throat opening, which would decrease the cross-sectional area of a particle of the medium when viewed along the Y-axis compared to the reference scenario, in which the first alignment apparatus 960 is inactive and does not produce the aforementioned first field, and in which the orientation is random of a particle at the first throat opening is random. In some configurations, this circular cross-sectional area of a particle in the first channel and incident on the first throat opening is smaller than the circular cross-sectional area of the throat 956. This alignment can increase the probability of a particle from a first reservoir 950 entering the throat 956 compared to the reference scenario. In other embodiments, the FPPA may not be aligned with the long axis of a particle, or the desired orientation axis of a particle entering or within throat 956. In this case, the orientation of the electric field in the first channel and in the vicinity of the first throat opening can be configured in a way in which the FPPA is likely to be in an orientation or configuration which corresponds to the particle being oriented or configured to be able to enter throat 956.

The magnitude of the component of the electric field in the axial direction, or "MCEFA" associated with the first alignment apparatus 960 varies with the axial and radial direction. In the configuration shown, MCEFA increases as the position along the Y-axis is decreased from the position of the first opening 954 to the approximate position of the first throat opening. This gradient in the MCEFA has the additional beneficial effect of exerting a force in the negative Y-direction on a polarized particle with a non-zero polarization component in the positive Y-direction, i.e. aligned with the field, where the particle is located in the vicinity of the central axis of the first channel. This force can further increase the probability of a particle from a first reservoir 950 entering the throat 956 compared to the reference scenario.

The magnitude of the circumferential component of the electric field associated with the first alignment apparatus 960 is zero in this embodiment. The length of the first alignment apparatus 960 along the Y-direction, as well as the spatial or temporal form of the electric field associated with the first alignment apparatus 960 depends on the application and can be optimized using methods known in the art.

Such a field can be generated in a multitude of ways. In this embodiment, the field is generated by an arrangement of electrically insulated charged material within bulk material 966. The first alignment apparatus 960 comprises a positively charged first collection of charge 962, and a negatively charged second collection of charge 961. In this way, the desired spatial distribution of electric field magnitude and direction can be generated. The net charge associated with first alignment apparatus 960 is zero in this embodiment. In other embodiments, there may be a net charge associated with the first alignment apparatus 960. In this simplified example each charge collection of first alignment apparatus 960 is in the shape of a ring which encompasses the first channel and throat 956. As a result of these charge collections, there are electric field lines which emanate from the first collection of charge 962 and are directed substantially in the axial direction, aligned with the positive Y-direction in the throat 956 and the first channel in the proximity of the first throat opening. This accounts for the aforementioned axial features of the resulting electric field. In this embodiment, the field is constant in time. The electrical insulation may be facilitated by an appropriate choice of electrically insulating bulk material. In other embodiments, the charge collections may insulated by a separate material. In other embodiments, first alignment apparatus 960 may comprise more than two such distinct collections of charge, where each charge collection may have a different net charge than an adjacent charge collection. This may allow the electric field surrounding the first throat opening to be configured in a manner that more closely approximates the optimal electric field for a given objective.

The collections of charge may be comprised of conducting material, such as copper, which may be electrically connected to a source of electric potential, such as a battery terminal. In other embodiments, the collections of charge are generated by the embedding of ions in an electrically insulating or semiconducting host material, such as bulk material 966. Alternatively, dipoles may be embedded within bulk material 966, or on the interface of bulk material 966 with a channel system in order to produce the desired electric field in the proximity of the first throat opening. Such methods are well known in the art.

The second alignment apparatus 963 is configured to generate a second electric field which can both polarize and, under certain conditions, also exert forces and moments on any particles of the medium in the proximity of the second alignment apparatus 963. One can define a lateral direction, which is parallel to the X-axis, and a longitudinal direction, which is parallel to the Z-axis in the configuration shown. The axial direction is the same as the axial direction of the first alignment apparatus 960. For example, the second electric field may be arranged as follows.

The electric field within the second channel and a portion of the second throat opening is substantially aligned with the lateral direction. The effect of the field is an increased probability of alignment of the FPPA of particles along the lateral direction. This corresponds to the alignment of the long axis of a molecule with the X-axis in the second channel, which would increase the cross-sectional area of a particle of the medium when viewed along the Y-axis compared to the reference scenario in which the second alignment apparatus 963 is inactive and does not produce the aforementioned second field. In some configurations, this cross-sectional area of a particle in the second channel and incident on the second throat opening is larger than the circular cross-sectional area of the throat 956. This alignment can decrease the probability of a particle from a second reservoir 951 entering the throat 956 compared to the reference scenario.

The magnitude of the component of the electric field in the Y-direction, and in the Z-direction also varies with position. In the proximity of the second throat opening these components are negligible in this particular, simplified configuration, however. The length of the second alignment apparatus 963 along the Y-direction, as well as the spatial or temporal form of the electric field associated with the second alignment apparatus 963 depends on the application and can be optimized using methods known in the art.

Such a field can be generated in a multitude of ways. In this embodiment, the field is generated by an arrangement of electrically insulated charged material within bulk material 966. The second alignment apparatus 963 comprises a positively charged first collection of charge 965, and a negatively charged second collection of charge 964. The net charge associated with second alignment apparatus 963 is zero in this embodiment. In other embodiments, there may be a net charge associated with the second alignment apparatus 963. In this simplified example each charge collection of second alignment apparatus 963 is in the shape of a rectangular plate with the characteristic normal parallel to the X-axis. As a result of these charge collections, there are electric field lines which emanate from the second collection of charge 965 and are directed substantially in the lateral direction, aligned with the negative X-direction in the throat 956 and the second channel in the proximity of the second throat opening. This accounts for the aforementioned lateral features of the resulting electric field. Other configurations of the collections of charge of the second alignment apparatus 963 are known in the art and have been mentioned in the context of the first alignment apparatus 960.

In some embodiments, a desired electric field can be generated by individual atoms or molecules of the second alignment apparatus 963. In this case the interaction between the particles of the medium and the second alignment apparatus 963 can be described as a dipole-dipole interaction opposed to a dipole-charge interaction shown in FIG. 2.

In other embodiments, the strength of the electric field can be regulated over time in order to control the interaction of the apparatus with particles of the medium. An appropriate electric field distribution in time and space can be determined using methods known in the art.

In other embodiments the objects may have a permanent dipole, such as is the case for water molecules. The dipole may also be magnetic, as in the case of the spin of an electron. A magnetic field can be used to align the particles of the medium with a desired direction. Such methods are well known in the art.

Note that the shape of a particle can also be modified within a first or second channel as a result of the polarization, for instance. A spherically symmetric particle in the first channel, when polarized along the axial direction, may assume an elongated shape with the long axis aligned with said axial direction. This can reduce the cross-sectional area of the particle viewed along the Y-axis compared to the reference scenario. Similarly, the long axis of such a polarized particle in the second channel may be aligned with the lateral axis. This can increase the cross-sectional area of the particle viewed along the Y-axis compared to the reference scenario. In other words, an alignment apparatus of an embodiment of the invention can be used to not only align an object to a desired cross-sectional geometry, but also to reshape or reconfigure an object to a desired cross-sectional geometry.

In some embodiments, the first alignment apparatus 960 may be configured in a similar manner as the second alignment apparatus 963, with the exception that the electric field in the vicinity of the first throat opening is perpendicular to the electric field in the vicinity of the second throat opening. The cross-section of the first alignment apparatus may thus also be square, with the collections of charge being arranged on opposing faces of the cubic first channel, with the characteristic normal of the rectangular plates of charge aligned with the Z-axis. In order to facilitate the passage of polarized particles with long axis parallel to the Z-axis from the first channel into the throat 956, the cross-sectional area of the throat may also be rectangular in this case, with a long axis parallel to the Z-axis, i.e. perpendicular to the electric field in the vicinity of the second throat opening. The dimension of the cross-section of the throat in the Z-direction may be equal to the same dimension of the cubic first and second channels.

Note that the object of interest may also be a photon. Consider a scenario in which a medium contains photons which have horizontal and vertical polarization components. The horizontal axis may be parallel to the X-axis, and the vertical axis may be parallel to the Z-axis. A first alignment apparatus may comprise a filtering apparatus and an alignment apparatus. In the filtering apparatus, the horizontally polarized components of a photon are separated from vertically polarized components. This separation can be accomplished using a mirror with vertical slits, for instance. Alternatively, crystals or other optical instruments can be used to accomplish such beam splitting. Vertically polarized photon components are allowed to pass through to a first throat opening, while horizontally polarized photon components are reflected by the filtering apparatus to the alignment apparatus. In the alignment apparatus, the polarization of the horizontally polarized components may be modified or rotated to align with the vertical components. Such apparatuses are well known in the art. The polarization plane can be rotated using liquid crystals, for example. Having passed through the alignment apparatus, the newly vertically polarized photons are also directed to pass through the first throat opening. Thus the polarization of a majority, preferably all, photons of a first reservoir 950 can be aligned to a specified type of polarization, such as a vertical polarization in this case. The throat 956 may be configured to allow vertically polarized photons to pass through, with all other components being reflected by the first inside surface 975 or the second inside surface 976. This alignment of polarizations of photons from the first reservoir 950 with the geometry of the first throat opening can increase the probability of a particle from a first reservoir 950 entering the throat 956 compared to the reference scenario. The second alignment apparatus may be configured in a similar manner as the first alignment apparatus, with the exception that the majority of photons from the second reservoir 951 are aligned with an orthogonal type of polarization compared to the polarization of photons at the first throat opening, after having interacted with the first alignment apparatus. After having interacted with the second alignment apparatus, photons of the second reservoir 951 may thus be polarized in a horizontal direction, in this example. Since the cross-section of the throat is uniform throughout, this polarization can decrease the probability of a photon from a second reservoir 951 entering the throat 956 compared to the reference scenario. The majority of horizontally polarized photons in the second channel are reflected by the second inside surface 976.

In general terms, one can describe the purpose of the first and second alignment apparatuses to be the generation of a force field. A force field is a vector field which defines the magnitude and direction which an object of interest would experience at a specified location at a specified time. An "object of interest" is the object which the apparatus of the invention is intended to interact with in the aforementioned manner. For example, within a conductor, such as a metal, the free or conducting electrons may be objects of interest, while the lattice atoms, or the bound electrons and nuclei, are other objects of the medium surrounding the apparatus. Note that the force field can vary in time and space, and may also be a function of the properties of a specified object at the specified point in space and time. For example, in the case in which the forces of the force field arise from the interaction of a charged particle with a magnetic field, the force at a specified location and time is also a function of the velocity of said particle. In accordance with some embodiments of the invention, the force field of an alignment apparatus is configured to modify the orientation of an object, e.g. by rotating a vector property of an object, or to modify the magnitude of a vector property of an object, e.g. by stretching or polarizing an object, through the action of attraction or repulsion by a force field generating apparatus, in a manner in which the uniformity in the magnitude or orientation of a vector property of an object of a medium in time or space, in the case of a default boundary condition, is disturbed by an extent which exceeds any expected, microscopic fluctuations of said vector properties of objects of the medium. A vector property of an object is a property which can be described in the form of at least one vector, i.e. a property with a defined magnitude and direction. Examples of a vector property are a polarization axis, a magnetic dipole axis, a principal axis as defined by an inertia tensor, or a geometric long axis as defined by the geometric shape of an object. Note that an aforementioned force field may interact with or exert forces on an object in a manner in which moments or torques are acting about the center of mass of an object. The term "force field" therefore also encompasses any field which can be considered to be a torque or moment field. The force field may in some embodiments also be described or expressed in terms of a gradient of a potential field. Examples of repulsion are the electrostatic repulsion between like charges and the reflection of photons by a mirror, or particles by a surface. Examples of attraction are the gravitational force, the van der Waals force, the electrostatic attraction between unlike charges, or the magnetic attraction between magnetic dipoles. Note that these disturbances need not involve a change in the average energy of an object. In some embodiments, or some applications, the average energy of an object may change throughout an interaction, where the change nevertheless provides an improvement on the prior art, as measured by an objective function.

The term "medium" used herein describes any material which is capable of containing, carrying, transporting, or transferring an object of interest. A medium may be a gas, liquid, solid, or vacuum, for example. By default, a medium refers to the collection of all objects which interact with a specified apparatus. The term "object" used herein describes any component of a medium. An object may be described as a particle, such as a dust particle, a soot particle, a water droplet, or a water molecule. An object may have a property of interest, as well as a defining property, which may be used to distinguish an object from other objects of the medium. The invention applies to any medium which can be considered to comprise distinct objects. One can define a "default boundary condition" as a simplified scenario in which the properties of the medium at a first reservoir and a second reservoir are identical and uniform in time and space. The "baseline scenario" is a scenario in which the filtering apparatus in question is replaced by a "baseline apparatus", defined as a solid, impenetrable, flat plate, and subjected to default boundary conditions. One can define a "baseline probability" as the probability for any object which interacts with a baseline apparatus to be located at a specified side of the baseline apparatus after the interaction is completed in a baseline scenario. In this case, the baseline probability is 50% for both sides of the baseline apparatus.

These artificial disturbances can be employed to increase or decrease a property of interest of objects of a specified defining property at a specified interface between a first and second reservoir, where the interface may be the throat facing side of the second throat opening, where the defining property may be the location of the object of interest in a first or second reservoir prior to interacting with an apparatus of the invention, where the property of interest may be the number of objects per unit volume, and where the increase or decrease is measured relative to the corresponding properties of the medium for a baseline scenario. In this particular type of embodiments of the invention, the defining property of an object is translated or imprinted on an object or a collection of objects by an alignment apparatus via the modification or disturbance of a filtered property of an object, such as the cross-sectional geometry of an object compared to the cross-sectional geometry of the throat when viewed along the Y-axis. A filtered property may be the magnitude or direction of a vector property of an object. A filtering apparatus, such as a throat with specified geometry surrounded by a reflective surface such as second surface 976, is configured to filter objects based on their filtered property, and by extension, their defining property. The filtering involves allowing the passage of objects with a specified set or range of filtered properties through the filtering apparatus, while reflecting a portion of objects outside of this set. By extension, therefore, a first alignment apparatus is configured to artificially increase the property of interest, i.e. density, of objects originating at a first reservoir at the second throat opening, where the density increase refers to a density which is, on average, larger than the density of objects of the medium in the first reservoir for the reference scenario. Alternatively, or concurrently, a second alignment apparatus may be configured to artificially decrease the density of objects originating at a second reservoir on the throat facing side of the second throat opening, where the density decrease refers to a density which is, on average, lower than the density of objects of the medium in the second reservoir for a reference scenario. As a result, there may be a net diffusion of a property of interest from a first reservoir 950 to a second reservoir 951.

The filtering apparatus can take several forms. For example, the filtering property may be the magnitude and orientation of a vector property of an object, such as the alignment of a permanent magnetic dipole of an object. In this example, the filtering apparatus may comprise a magnetic field, which is configured to reflect objects with a particular magnetic dipole orientation and allow the passage of objects with other permanent magnetic dipole orientations. Such a magnetic field can be generated by permanent magnetic dipoles embedded in the bulk material 966 in the vicinity of the second or first throat opening.

In the context of the simplified embodiment in FIG. 2, one can define an interaction between a particle and the depicted apparatus to commence when a particle passes through, intersects, or comes into contact with, planes containing the first surface 952 or the second surface 953, where the planes are parallel to the XZ-plane, and where the direction of travel prior to the interaction is in the opposite direction of the outward normal of the associated surface of the bulk material, which is directed in the positive Y-direction for the first surface 952, and the negative Y-direction for the second surface 953. These planes are denoted the first plane, and the second plane, respectively. An interaction can be defined to end when a particle no longer intersects or is in contact with the aforementioned planes. Said "contact" can in this case be defined as the existence of a non-negligible force between an object of the medium and an object of the apparatus, such as an object of bulk material 966.

One can define "input properties of interest" and "output properties of interest" as the properties of interest of a specified class of objects immediately before and immediately after interacting in a non-negligible manner with an embodiment of the invention, respectively. A property of interest may be the location of an object in either the first reservoir 950 or the second reservoir 951. The interaction of an object of interest with the apparatus of the invention can be described in terms of the difference between the input and output properties of interest. For example, an interaction can be described as either a transmission from the one reservoir to another reservoir, or a reflection back into the reservoir the object was located in before the interaction began. By definition, the type of interaction is a function of the "defining properties" of an object. The set of defining properties of the objects of interest may comprise the properties which distinguish the object of interest from other objects of the surrounding medium. In the embodiment shown in FIG. 2, the set of defining properties of an object also includes the input property of interest, i.e. the location of an object in either the first reservoir 950 or the second reservoir 951 immediately before interacting in a non-negligible manner with an embodiment of the invention. Throughout an interaction, an apparatus configured and operated in accordance with some embodiments of the invention will distinguish between or filter objects based on the value of the defining property of an object. In other words, the expected value of the type of interaction between a specified class of objects with at least one specified defining property and an embodiment of the invention is not equal to the expected value of the type of interaction of objects of the same specified class but different specified defining property. The expected value is the statistical expectation calculated for all objects contained within at least one specified class of objects which interact with an embodiment of the invention in a sufficiently long duration of time to provide a sufficiently accurate result. By default, a class of objects comprises all objects which interact with a specified apparatus.

In the context of this generation of embodiments, an embodiment of the invention is configured to align objects originating at a first reservoir 950 such that they may more readily pass through an alignment filter before they arrive at an interface to the second reservoir 951, such as the second throat opening, compared to a reference scenario. The alignment of objects is facilitated by a first alignment apparatus 960. In this way, the probability of an object arriving at the second throat opening to have originated at the first reservoir 950 is increased beyond the baseline probability of 50%.

The embodiment shown in FIG. 2 is also configured to align objects originating at a second reservoir 951 such that they may more readily be reflected by an alignment filter before they arrive at an interface to the first reservoir 950, such as the throat facing side of the second throat opening. The alignment of objects is facilitated by a second alignment apparatus 963, while the reflection is accomplished by a second inside surface 976. In this way, the probability of an object arriving at the throat facing side of the second throat opening to have originated at the second reservoir 951 is decreased below the baseline probability of 50%. As a result there may be a net diffusion of a property of interest from a first reservoir 950 to a second reservoir 951. In other embodiments, other such alignment and alignment filtering mechanisms may be used. There are a wide variety of such methods known in the art for any given application. Once the default boundary condition is removed, and the first and second reservoirs are assumed to be finite in size and otherwise isolated from each other and any other reservoirs, the concentration of objects of interest in the first reservoir could be reduced over time, while the concentration of objects in the second reservoir could be increased correspondingly. Embodiments of the invention can thus also be considered for applications involving pumping. Connecting several stages of the apparatus shown in FIG. 2 in series, i.e. allowing the second reservoir of a first apparatus to coincide with the first reservoir of a second apparatus, could achieve a desired steady-state concentration of objects of interest in a first reservoir 950.

In this particular embodiment, the aforementioned alignment is accomplished by the electric field of the first and second alignment apparatuses. Consider the trajectory 970 of particle 969, which has a non-zero velocity component in the negative Y-direction and is located in the first reservoir 950 preceding the interaction with the depicted apparatus. As the particle enters the electric field of a first alignment apparatus, such as first alignment apparatus 960, it is polarized and, due to a unique FPPA which is also parallel to the geometric long axis of the particle, aligned with the local electric field and the Y-axis in the first channel in the vicinity of the first throat opening. This sufficiently reduces the cross-section of the particle along the Y-direction and allows the particle to diffuse through the first throat opening into the throat, such as throat 956. Once inside the throat, the particle may continue to diffuse in the negative Y-direction, resulting in a passage through the second throat opening and through the second channel into the second reservoir 951. Note that the particle is temporarily aligned with the X-axis as is passes through the second channel due to the electric field produced by the second alignment apparatus 963. Trajectory 968 of particle 967 shows a similar interaction. Particle 971 has a non-zero velocity component in the positive Y-direction and is located in the second reservoir 951 preceding the interaction with the depicted apparatus. As indicated by trajectory 972, as particle 971 enters the electric field of the second alignment apparatus, it is polarized and aligned with the local electric field and the X-axis in the second channel in the vicinity of the second throat opening. This sufficiently increases the cross-section of the particle along the Y-direction and allows the particle to be reflected by the second inside surface, such as second inside surface 976, and return through the second channel and the second opening 955 into the second reservoir 951. Trajectory 974 of particle 973 shows a similar interaction. Note that some particles which originate at the first reservoir 950 will return to the first reservoir 950 once the interaction is complete. Similarly, some particles which originate at the second reservoir 951 will be found at the first reservoir 950 once the interaction is complete. This may occur for several reason. The intrinsic rotation of particles may not allow the alignment apparatuses to align all particles in the desired direction. On average, however, the apparatus is configured in such a manner, that there is a net diffusion of particles from the first reservoir 950 to the second reservoir 951 throughout an interaction for the default boundary condition.

One can define a first capture surface as the surface describing the first opening 954, and the second capture surface as the surface describing the second opening 955, where first and second capture surfaces are parallel to the XZ-plane. In this embodiment, the circular first capture area is smaller than the square second capture area. One can define a "first footprint surface" to be the total surface that forms an interface to the first reservoir 950 and is associated with an apparatus unit, i.e. the sum of the first capture surface and any portion of the first surface 952 associated with an apparatus unit. The boundary of the footprint surface of an apparatus unit is provided by the boundary of other footprint surfaces of adjacent apparatus units, where the apparatus units are, at least hypothetically, arranged periodically in the XZ-plane. For example, the boundary of a first footprint surface may have a hexagonal shape. Similarly, one can define a "second footprint surface" as the projection of the first footprint surface on the second surface 953. One can define a control volume which is bounded by the first footprint surface, the second footprint surface, as well as the surface parallel to the Y-axis connecting corresponding points of the first and second footprint surfaces of the control volume. For the default boundary condition, the probability of an object of the medium being located in the first reservoir 950 prior to interacting with the first or second footprint surface is 50%, with the other 50% applying to the second reservoir 951. Since the first capture area is smaller than the second capture area, the probability of a particle entering the channel system from the first reservoir 950 is smaller than the probability of a particle entering the channel system from the second reservoir 951. The fraction of particles which enter the channel system via the first opening 954 and exit via a second opening 955 is denoted the "first transmissivity". The fraction of particles which enter the channel system via a second opening 955 and exit via a first opening 954 is denoted the "second transmissivity". For the default boundary condition, there will be a net flow rate of objects from the first reservoir 950 to the second reservoir 951 when the net diffusivity is greater than one, where the net diffusivity is calculated by multiplying the ratio of the first and second transmissivity by the ratio of the first and second capture area. In the embodiment shown, the first alignment apparatus 960 and the second alignment apparatus 963 are configured to ensure that the ratio of the first transmissivity to the second transmissivity is larger than one and large enough to compensate for a ratio of the first capture area to the second capture area which is smaller than one, such that the net diffusivity is greater than one. The geometry of the channel system, the configuration of the alignment apparatuses, and the ratio of the first capture area to the second capture area are examples of parameters that can be optimized using methods known in the art in order to maximize an objective subject to constraints. The objective may be the net flow rate of a property of interest from the first reservoir 950 to the second reservoir 951.

The effectiveness of the depicted apparatus may be a function of the geometry and the scale, or the size, of the apparatus. The height of the depicted apparatus is defined to be the dimension of the apparatus along the Y-axis, i.e. the shortest distance between the first surface 952 and the second surface 953. It may be desirable to avoid excessive scattering amongst objects of interest, scattering between objects of interest and other objects of a medium, as well as any diffuse reflection by the walls within the channel system. Although such scattering behavior can be taken into account and, at least partially, compensated for in the configuration of the apparatus, it may degrade the intended performance of the apparatus, by reducing the first transmissivity or increasing the second transmissivity, for instance. In the absence of scattering, the initially necessarily negative Y-velocity component of a particle entering the channel system from the first reservoir 950, for example, is more likely to be maintained, which would enhance the first transmissivity. Scattering of objects of interest by other objects in the first or second channel may also affect or disrupt the alignment of the objects of interest and affect the first or second transmissivity. Diffuse reflection or scattering by the walls of the throat may also affect the probability of a particle entering the throat through the first throat opening also exiting the throat through the second throat opening. Other types of scattering may also apply to other embodiments of the invention.

There are several approaches for reducing such scattering. For example, any reflective surfaces of an apparatus can be constructed in a manner which avoids or reduces diffuse reflections. An apparatus can also be configured to reduce the expected number of reflections of objects by any reflective surfaces of an apparatus in order to reduce any reductions in transmissivity associated with diffuse reflections. The apparatus may also be configured to be of a small size in order to minimize the probability of scattering between objects of interest and other objects of a medium by reducing the expected number of these objects being present in a channel system at an instant in time. In some embodiments it may also be possible to artificially exclude, filter, or remove such other objects of the medium from a channel system, while allowing a sufficient portion of objects of interest to interact with the channel system as intended. To maintain a high first transmissivity despite scattering amongst objects of interest, it may be desirable for the height of the apparatus to be smaller than a length and several orders of magnitude larger than the mean free path of an object of interest in the medium for a default boundary condition, for example. In some embodiments, it may even be preferable for the height of the apparatus to be a fraction of the mean free path, where a fraction means less than one. The characteristic width of a channel, such as the diameter of the first channel is subject to similar considerations. The width of the first channel may also be within several orders of magnitude of the mean free path of an object of interest in the medium, for example. The width may also be a fraction of the mean free path, depending on the application and the properties of the medium. Note that there may be more than one throat channel connecting a first channel to a second channel Note that in some cases, it may be possible and desirable to configure a medium in a way in which the objects of interest have a suitable mean free path length. For instance, the density of a medium in the first and second reservoir may be regulated or modified to a suitable value. Amongst other factors, suitability may be determined by the relation between the tolerances of a specified manufacturing method and the required size and shape resolution of an apparatus of the invention. The appropriate material, geometry, and method of manufacture can be found by those skilled in the art. Note that such size considerations apply to all embodiments of the invention, even though they may have a negligible effect for some applications.

Unless specified or clear from context, the term "or" is equivalent to "and/or" throughout this paper.

An apparatus unit for selectively transmitting objects of interest can comprise a bulk material; a throat disposed within the bulk material and extending from the first throat opening to a second throat opening; and a first alignment apparatus disposed in proximity to the throat, wherein the alignment apparatus is configured to align objects of interest with respect to the throat within less than 1000 mean free path lengths of the objects of interest from the first throat opening. A throat is a directional element that can diffusively couple a first reservoir and a second reservoir. Interaction of the objects of interest with the focusing apparatus can increase or decrease the probability that the objects of interest pass through the throat. Selectively transmitting can comprise changing a trajectory of the objects of interest or a property of the objects of interest in such a way that the objects have a higher probability of passing through throat. For example, objects can be aligned to pass through the throat or to be reflected from the apparatus.

A throat can have any suitable shape and can have segments that have a larger or smaller area than other segments. For example, a throat can comprise a first channel, a second channel, and a narrow throat coupling the first and second channels, where the first and second channels have a large cross-sectional area than the throat.

A throat can have a cross-sectional area that is larger than a smallest cross-sectional area of an object before interacting with the apparatus unit; and smaller than the largest cross-sectional area of the object after interacting with the apparatus unit.

A bulk material comprises wherein the bulk material comprises a metal, a metal alloy, a ceramic, a composite, a thermoplastic, a thermoset, a semiconducting material, electrically insulating material, a semiconducting material, an electrically insulating material, a glass, or a combination of any of the foregoing. Inner surfaces of the bulk material can be configured to reflect the objects of interest.

The alignment apparatus can be configured to generate an electromagnetic field aligned such that objects of interest interacting with the electromagnetic field have a higher probability of entering the throat. An apparatus subunit can comprise one or more alignment apparatus. An alignment apparatus can generate an electromagnetic field having any suitable alignment with respect to the longitudinal axis of the throat. An alignment apparatus can comprise one or more charge collections and/or one or more dipole collections. An alignment apparatus can be disposed within the bulk material in proximity to the throat, such as in proximity to the first throat opening and/or the second throat opening. The charge/dipole collections can be in the shape of annular rings, annular ring sections, a plate, a cylinder, cylinder sections, or any suitable shape. The electromagnetic field can be an electrical field or a magnetic field. Charge collections can comprise an electrically conductive material interconnected to an electrical potential. Charge collections can comprise electrons or ions embedded within an electrically insulating or semiconducting material. Dipole collections can comprise dipoles such as permanent magnetic dipoles embedded within an electrically insulating or semiconducting material.

Alignment apparatus can be configured, for example, to align objects of interest with a throat opening, change the shape of objects of interest, change an orientation of an object of interest or change a vector property of the objects of interest. Changing a vector property can comprise, for example, rotating a vector property of the objects of inters and/or modifying the magnitude of a vector property of an object of interest. A vector property can comprise, for example, a polarization axis, a magnetic dipole axis, a principal axis as derived by an inertia tensor, or a geometric long axis as derived by the geometric shape of the objects of interest. An electromagnetic field can be configured to exert moments or torques about the center of mass of the o objects of interest. An electromagnetic field can be configured to generate a force field on the objects of interest.

An object of interest can be particle such as dust particles, soot particles, water droplets, water molecules, or a combination of any of the foregoing.

Alignment can occur within less than 10 mean free path lengths of the objects of interest, such as less than 1 mean free path length.

Systems provided by the present disclosure can comprise one or more of the apparatus units. Apparatus units can be provided of arrays having, for example, from 1 to 100,000,000 apparatus units. Planar arrays of apparatus units can be stacked on top of each other and/or side by side. One or more apparatus units in a planar array can be diffusively coupled to one or more apparatus unit in another planer array. For example, a second throat opening of a first apparatus unit is diffusively coupled to a first throat opening of a second apparatus unit.

Method provided by the present disclosure for selectively transmitting objects of interest from a first reservoir to a second reservoir can comprise providing the apparatus unit provided by the present disclosure, wherein the first throat opening is diffusively coupled to the first reservoir and the second throat opening is diffusively coupled to the second reservoir; and generating a force field by activating the first alignment apparatus; thereby causing a selective transmission of the objects of interest from the first reservoir to the second reservoir.

Methods provided by the present disclosure for selectively transmitting objects of interest from a first reservoir to a second reservoir, can comprise providing the system provided by the present disclosure, wherein the first throat opening is diffusively coupled to the first reservoir and the second throat opening is diffusively coupled to the second reservoir; and generating a force field by activating the first alignment apparatus; thereby causing a selective transmission of the objects of interest from the first reservoir to the second reservoir.

The embodiments and methods described in this paper are only meant to exemplify and illustrate the principles of the invention. This invention can be carried out in several different ways and is not limited to the examples, embodiments, arrangements, configurations, or methods of operation described in this paper or depicted in the drawings. This also applies to cases where just one embodiment is described or depicted. Those skilled in the art will be able to devise numerous alternative examples, embodiments, arrangements, configurations, or methods of operation, that, while not shown or described herein, embody the principles of the invention and thus are within its spirit and scope.

ASPECTS OF THE INVENTION

The invention is further defined by the following aspects.

Aspect 1. An apparatus unit for selectively transmitting objects of interest, wherein the apparatus unit comprises: a bulk material; a throat disposed within the bulk material and extending from a first throat opening to a second throat opening opposite the first throat opening; and wherein the throat has length that is less than 1000 mean free path lengths of the objects of interest before interacting with the apparatus unit; and a first focusing apparatus, wherein the first focusing apparatus is disposed within the bulk material and in proximity to at least a portion of the throat.

Aspect 2. The apparatus unit of aspect 1, wherein the first focusing apparatus comprises: an inside apparatus disposed within at least a portion of the throat; an inside focusing apparatus disposed within the inside apparatus; and an outside focusing apparatus disposed within the bulk material an in alignment with at least a portion of the inside focusing apparatus.

Aspect 3. The apparatus unit of aspect 2, wherein, the inside focusing apparatus comprises a plurality of inside charge collections; and the outside focusing apparatus comprises a plurality of outside charge collections.

Aspect 4. The apparatus unit of aspect 3, wherein, each of the one or more outside charge collections has a negative charge; and each of the one or more inside charge collections has a positive charge.

Aspect 5. The apparatus unit of any one of aspects 2 to 4, wherein the outside focusing apparatus surrounds at least a portion of the first channel and at least a portion of the throat.

Aspect 6. The apparatus unit of any one of aspects 2 to 5, wherein the throat further comprises: a first channel disposed within the bulk material and extending from a first opening to the first throat opening opposite the first opening; and/or a second channel disposed within the bulk material extending from the second throat opening to a second opening.

Aspect 7. The apparatus unit of aspect 6, wherein throat comprises the first channel and the inside apparatus is disposed within at least a portion of the first channel.

Aspect 8. The apparatus unit of any one of aspects 6 to 7, wherein each of the first channel, the throat, the second channel, and the inside apparatus are cylindrical in shape.

Aspect 9. The apparatus unit of any one of aspects 6 to 8, wherein the inside apparatus extends at least from the first opening to within at least a portion of the throat.

Aspect 10. The apparatus unit of any one of aspects 6 to 9, wherein the first channel, the throat, the second channel, and the inside apparatus are symmetrically aligned on a common axis.

Aspect 11. The apparatus unit of any one of aspects 6 to 10, wherein each of the first channel, the throat, and the second channel comprise a circular cross-section.

Aspect 12. The apparatus unit of any one of aspects 6 to 11, wherein the cross-sectional area of the throat is less than a cross-sectional area of the first opening and a cross-sectional area of the second opening.

Aspect 13. The apparatus unit of any one of aspects 1 to 12, wherein the throat comprises a width that is less than 1000 times the mean free path length of the objects of interest before interacting with the apparatus unit.

Aspect 14. The apparatus unit of any one of aspects 1 to 12, wherein the throat comprises width that is less than 100 times the mean free path length of the objects of interest before interacting with the apparatus unit.

Aspect 15. The apparatus unit of any one of aspects 1 to 14, wherein the throat has a length on the order of one free mean path length of the objects of interest before interacting with the apparatus unit.

Aspect 16. The apparatus unit of any one of aspects 1 to 15, wherein the first focusing apparatus is disposed in proximity to the first throat opening and is configured to pull objects of interest toward the bulk material in proximity to the first throat opening.

Aspect 17. The apparatus unit of any one of aspects 1 to 16, wherein the first focusing apparatus is disposed in proximity to the first throat opening and is configured to repel the objects of interest away from the bulk material in proximity to the first throat opening.

Aspect 18. The apparatus unit of any one of aspects 1 to 17, further comprising a second focusing apparatus disposed within the bulk material and in proximity to the second throat opening.

Aspect 19. The apparatus unit of any one of aspects 1 to 18, wherein the second focusing apparatus is configured to pull objects of interest toward the bulk material in proximity to the second throat opening.

Aspect 20. The apparatus unit of any one of aspects 1 to 19, wherein the second focusing apparatus is configured to repel the objects of interest away from the bulk material in proximity to the second throat opening.

Aspect 21. The apparatus unit of any one of aspects 1 to 20, wherein the second focusing apparatus comprises one or more charge collections or one or more dipole collections.

Aspect 22. The apparatus unit of aspect 21, wherein the one or more charge collections are disposed within the bulk material.

Aspect 23. The apparatus unit of any one of aspects 21 to 22, wherein each of the one or more charge collections are in the shape of an annular ring.

Aspect 24. The apparatus unit of any one of aspects 18 to 23, wherein the second focusing apparatus is configured to generate an electromagnetic field magnitude gradient.

Aspect 25. The apparatus unit of aspect 24, wherein, the electromagnetic field magnitude gradient has a maximum in proximity the first throat opening; the electromagnetic field magnitude gradient has a minimum in proximity the first throat opening; the electromagnetic field magnitude gradient has a maximum toward a center of the focusing apparatus; or the electromagnetic field magnitude gradient has a minimum toward a center of the focusing apparatus.

Aspect 26. The apparatus unit of any one of aspects 24 to 25, wherein the electromagnetic field comprises an electrical field, a magnetic field, or a combination thereof.

Aspect 27. The apparatus unit of any one of aspects 1 to 26, wherein the first focusing apparatus comprises one or more charge collections.

Aspect 28. The apparatus unit of aspect 27, wherein each of the one or more charge collections is independently in the shape of an annular ring and/or a segment of an annular ring.

Aspect 29. The apparatus unit of any one of aspects 27 to 28, wherein each of the one or more charge collections is electrically insulated from the bulk material.

Aspect 30. The apparatus unit of any one of aspects 27 to 29, wherein each of the one or charge collections comprise an electrically conductive material.

Aspect 31. The apparatus unit of any one of aspects 27 to 30, wherein each the one or more outside charge collections is interconnected to an electrical potential.

Aspect 32. The apparatus unit of any one of aspects 27 to 31, wherein each of the one or more charge collections comprise embedded electrons or ions in an electrically insulating or semiconducting material.

Aspect 33. The apparatus unit of any one of aspects 27 to 32, wherein the one or more inside charge collections are configured to produce an electric field magnitude gradient.

Aspect 34. The apparatus unit of aspect 33, wherein the electric field magnitude gradient increases toward the throat opening.

Aspect 35. The apparatus unit of any one of aspects 33 to 34, wherein the electric field magnitude gradient increases toward the center of the plurality of inside charge collections.

Aspect 36. The apparatus unit of any one of aspects 1 to 35, wherein the first focusing apparatus is configured to generate an electromagnetic field magnitude gradient.

Aspect 37. The apparatus unit of aspect 36, wherein, the electromagnetic field magnitude gradient has a maximum in proximity the first throat opening; the electromagnetic field magnitude gradient has a minimum in proximity the first throat opening; the electromagnetic field magnitude gradient has a maximum toward a center of the focusing apparatus; or the electromagnetic field magnitude gradient has a minimum toward a center of the focusing apparatus.

Aspect 38. The apparatus unit of any one of aspects 36 to 37, wherein the electromagnetic field comprises an electrical field, a magnetic field, or a combination thereof.

Aspect 39. The apparatus unit of any one of aspects 1 to 38, wherein the bulk material comprises a metal, a metal alloy, a ceramic, a composite, a thermoplastic, a thermoset, a semiconducting material, electrically insulating material, a semiconducting material, an electrically insulating material, a glass, or a combination of any of the foregoing.

Aspect 40. The apparatus unit of any one of aspects 1 to 39, wherein inner surfaces of the bulk material are configured to reflect at least a portion of objects of interest.

Aspect 41. The apparatus unit of any one of aspects 1 to 40, wherein the objects of interest comprise electrically charged objects of interest comprise electrons, ions or charged dust particles or aerosols, or permanent or induced electric dipoles, atoms, or molecules or permanent or induced magnetic dipoles, or combinations of any of the foregoing.

Aspect 42. The apparatus unit of any one of aspects 1 to 41, wherein the objects of interest are polarized.

Aspect 43. The apparatus unit of any one of aspects 1 to 41, wherein the objects of interest comprises a permanent charge.

Aspect 44. The apparatus unit of any one of aspects 1 to 41, wherein the objects of interest are neutral.

Aspect 45. The apparatus unit of any one of aspects 1 to 44, wherein the apparatus unit is configured to change a property of the objects of interest in proximity the first throat opening and/or the second throat opening.

Aspect 46. The apparatus unit of aspect 45, wherein the property is the number density of the objects of interest at the first throat opening and/or the second throat opening.

Aspect 47. The apparatus unit of any one of aspects 45 to 46, wherein the change in the property is induced by interaction with the first focusing apparatus.

Aspect 48. The apparatus unit of aspect 45, wherein the property is a vector property of the objects of interest at the first throat opening and/or the second throat opening.

Aspect 49. The apparatus unit of aspect 48, wherein the objects of interest comprise photons, electrons, objects having a permanent or induced electric dipole, objects having a permanent or induced magnetic dipole, objects having as a polarization axis, or a combination of any of the foregoing.

Aspect 50. The apparatus unit of any one of aspects 48 to 49, wherein changing a vector property comprises changing the orientation of the objects of interest with respect to the geometry of the first throat opening and/or the second throat opening.

Aspect 51. The apparatus unit of any one of aspects 1 to 50, wherein, the objects of interest comprise a first property before entering the throat from a first direction; and the objects of interest comprise a second property before entering the throat from a second direction, wherein the first property is different than the second property.

Aspect 52. The apparatus unit of any one of aspects 1 to 51, wherein the first throat opening is diffusively coupled to a first reservoir with respect to the objects of interest of interest; and the second throat is diffusively coupled to a second reservoir with respect to the objects of interest of interest.

Aspect 53. The apparatus unit of aspect 52, wherein each of the first reservoir and the second reservoir independently comprises an electromagnetic field.

Aspect 54. The apparatus unit of any one of aspects 52 to 53, further comprising: a first reservoir focusing/defocusing apparatus within the first reservoir and in proximity to the first throat opening; and/or a second reservoir focusing/defocusing apparatus within the second reservoir and in proximity to the second throat opening.

Aspect 55. The apparatus unit of aspect 54, wherein each of the first reservoir and second reservoir focusing/defocusing apparatus is independently configured to focus a trajectory of the objects of interest from a reflection trajectory to a transmission trajectory.

Aspect 56. The apparatus unit of aspect 54, wherein each of the first reservoir and second reservoir focusing/defocusing apparatus is independently configured to change a trajectory of the objects of interest in the first reservoir and/or the second reservoir prior to interaction with the apparatus unit.

Aspect 57. The apparatus unit of aspect 56, wherein changing a trajectory comprises changing the trajectory from a reflection trajectory to a transmission trajectory; or changing the trajectory from a transmission trajectory to a reflection trajectory.

Aspect 58. A system comprising two or more of the apparatus units of any one of aspects 1 to 57.

Aspect 59. The system of aspect 58, comprising a planar array of the apparatus units of claim 1.

Aspect 60. The system of aspect 59, wherein the system comprises a plurality of the planar arrays, wherein at least one of the planar arrays are disposed in a direction normal to another planar array.

Aspect 61. The system of any one of aspects 58 to 60, further comprising two or more of the apparatus units of claim 1 coupled in series.

Aspect 62. The system of aspect 61, wherein a second throat opening of a first apparatus unit is diffusively coupled to a first throat opening of a second apparatus unit.

Aspect 63. A method of selectively transmitting objects of interest from a first reservoir to a second reservoir, comprising: providing the apparatus unit of any one of aspects 1 to 57, wherein the first throat opening is diffusively coupled to the first reservoir and the second throat opening diffusively coupled to the second reservoir; and generating a force field by activating the first focusing apparatus, to thereby selectively transmit objects of interest from the first reservoir to the second reservoir.

Aspect 63. A method of selectively transmitting objects of interest from a first reservoir to a second reservoir, comprising: providing the system of any one of aspects 58 to 62, wherein the first throat opening is diffusively coupled to the first reservoir and the second throat opening diffusively coupled to the second reservoir; and generating a force field by activating the first focusing apparatus, to thereby selectively transmit objects of interest from the first reservoir to the second reservoir.

Aspect 1A. An apparatus unit for selectively transmitting objects of interest, wherein the apparatus unit comprises a bulk material; a throat disposed within the bulk material and extending from the first throat opening to a second throat opening; and a first alignment apparatus disposed in proximity to the throat, wherein the alignment apparatus is configured to align objects of interest with respect to the throat within less than 1000 mean free path lengths of the objects of interest from the first throat opening, Aspect 2A. The apparatus unit of aspect 1A, wherein interaction of the objects of interest with the first alignment apparatus increases the probability the objects of interest pas through the throat.

Aspect 3A. The apparatus unit of any one of aspects 1A to 2A, wherein selectively transmitting comprises selectively transmitting based on a property of the objects of interest and/or a property of the objects of interest induced by the apparatus unit.

Aspect 4A. The apparatus unit of any one of aspects 1A to 3A, wherein selectively transmitting comprises reflecting and/or aligning.

Aspect 5A. The apparatus unit of any one of aspects 1A to 4A, wherein the apparatus unit further comprises: a first channel diffusively coupled to the first throat opening; and a second channel diffusively coupled to the second throat opening.

Aspect 6A. The apparatus unit of aspect 5A, wherein the first alignment apparatus comprises: at least one first collection of charge disposed within the bulk material and in proximity to a portion of the throat; at least one second collection of charge disposed within the bulk material and in proximity to the first channel; and a second alignment apparatus, wherein the second alignment apparatus comprises: at least one third collection of charge disposed within the bulk material and in proximity to a portion of the throat and in proximity to the second channel; and at least one fourth collection of charge disposed within the bulk material and in proximity to a portion of the throat and in proximity to the second channel.

Aspect 7A. The apparatus unit of any one of aspects 5A to 6A, wherein each of the first channel, the throat, and the second channel independently have a cross-section that is circular, square, rectangular, or polygonal.

Aspect 8A. The apparatus unit of any one of aspects 5A to 7A, wherein the throat comprises a cross-sectional shape of aligned objects of interest.

Aspect 9A. The apparatus unit of any one of aspects 5A to 8A, wherein each of the first channel, the throat, the second channel, and the inside apparatus are cylindrical in shape.

Aspect 10A. The apparatus unit of any one of aspects 5A to 6A, wherein a cross-sectional area of the throat is less than a cross-sectional area of the first channel and a cross-sectional area of the second channel.

Aspect 11A. The apparatus unit of any one of aspects 5A to 10A, wherein each of the first channel the throat and the second channel comprise a circular cross-section.

Aspect 12A. The apparatus unit of any one of aspects 5A to 11A, wherein the first channel, the throat, and the second channel are symmetrically aligned about a common axis.

Aspect 13A. The apparatus unit of any one of aspects 1A to 12A, wherein the throat has a cross-sectional area that is: larger than a smallest cross-sectional area of an object before interacting with the apparatus unit; and smaller than the largest cross-sectional area of the object after interacting with the apparatus unit.

Aspect 14A. The apparatus unit of any one of aspects 1A to 13A, wherein the bulk material comprises wherein the bulk material comprises a metal, a metal alloy, a ceramic, a composite, a thermoplastic, a thermoset, a semiconducting material, electrically insulating material, a semiconducting material, an electrically insulating material, a glass, or a combination of any of the foregoing.

Aspect 15A. The apparatus unit of any one of aspects 1A to 14A, wherein inner surfaces of the bulk material are configured to reflect the objects of interest.

Aspect 16A. The apparatus unit of any one of aspects 1A to 15A, wherein the first alignment apparatus is configured to generate an electromagnetic field aligned such that objects of interest interacting with the electromagnetic field have a higher probability of entering the throat Aspect 17A. The apparatus unit of any one of aspects 1A to 16A, wherein the first alignment apparatus is configured to generate an electromagnetic field substantially aligned with a longitudinal axis of the throat.

Aspect 18A. The apparatus unit of any one of aspects 1A to 17A, wherein the first alignment apparatus is configured to generate an electromagnetic field substantially aligned orthogonal to a longitudinal axis of the throat.

Aspect 19A. The apparatus unit of any one of aspects 1A to 18A, wherein the first alignment apparatus comprises: at least one first charge and/or dipole collection disposed in proximity a portion of the throat, and/or at least one second charge and/or dipole collection disposed in proximity to the first channel and toward the first opening.

Aspect 20A. The apparatus unit of aspect 19A, wherein, the at least one first charge collection is positively charged; and the at least one second charge collection is negatively charged.

Aspect 21A. The apparatus unit of any one of aspects 19A to 20A, wherein each of the at least one first charge collections and each of the at least one second charge collection have the shape of an annular ring.

Aspect 22A. The apparatus unit of any one of aspects 19A to 21A, wherein each of the at least one first charge collections and each of the at least one second charge collections independently comprises a continuous annular ring or a discontinuous annular ring.

Aspect 23A. The apparatus unit of any one of aspects 19A to 22A, wherein each of the at least one first charge collections and each of the at least one second charge collections is electrically insulated from the bulk material.

Aspect 24A. The apparatus unit of any one of aspects 19A to 23A, wherein each of the at least one first charge collections and each of the at least one second charge collections comprise an electrically conductive material.

Aspect 25A. The apparatus unit of any one of aspects 19A to 24A, wherein each of the at least one first charge collections and each of the at least one second charge collections are interconnected to an electrical potential.

Aspect 26A. The apparatus unit of any one of aspects 19A to 25A, wherein each of the at least one first charge collections and each of the at least one second charge collections comprise electrons or ions embedded in an electrically insulating or semiconducting material.

Aspect 27A. The apparatus unit of any one of aspects 19A to 26A, wherein each of the at least one first charge collections and each of the at least one second charge collections comprise dipoles embedded within an electrically insulating or semiconducting host material.

Aspect 28A. The apparatus unit of aspect 27A, wherein the dipoles comprise permanent magnetic dipoles.

Aspect 29A. The apparatus unit of aspect 27A, wherein the dipoles comprise a current loop configured to generate a magnetic field.

Aspect 30A. The apparatus unit of any one of aspects 1A to 29A, wherein the first alignment apparatus is configured to generate an electromagnetic field.

Aspect 31A. The apparatus unit of aspect 30A, wherein the electromagnetic field is configured to induce a dipole moment in the objects of interest.

Aspect 32A. The apparatus unit of any one of aspects 30A to 31A, wherein the electromagnetic filed is configured to align the objects of interest with the throat.

Aspect 33A. The apparatus unit of any one of aspects 30 to 32A, wherein the electromagnetic field is configured to change the shape of the objects of interest.

Aspect 34A. The apparatus unit of any one of aspects 30A to 33A, wherein the electromagnetic field is configured to modify the orientation of the objects of interest.

Aspect 35A. The apparatus unit of aspect 34A, wherein modifying the orientation comprises rotating a vector property of the objects of interest or modifying the magnitude of a vector property of the objects of interest.

Aspect 36A. The apparatus unit of aspect 35A, wherein the vector property comprises a polarization axis, a magnetic dipole axis, a principal axis as derived by an inertia tensor, or a geometric long axis as derived by the geometric shape of the objects of interest.

Aspect 37A. The apparatus unit of any one of aspects 30A to 36A, wherein the electromagnetic field is configured to exert moments or torques about the center of mass of the o objects of interest.

Aspect 38A. The apparatus unit of any one of aspects 30A to 37A, wherein the electromagnetic field is configured to generate a force field on the objects of interest.

Aspect 39A. The apparatus unit of any one of aspects 1A to 38A, wherein the apparatus unit comprises a second alignment apparatus disposed in proximity to the throat.

Aspect 40A. The apparatus unit of aspect 39A, wherein the second alignment apparatus is configured to generate an electromagnetic field orthogonal to a longitudinal axis of the throat.

Aspect 41A. The apparatus unit of any one of aspects 39A to 40A, wherein the second alignment apparatus comprises an electromagnetic alignment apparatus.

Aspect 42A. The apparatus unit of aspect 41A, wherein the electromagnetic alignment apparatus comprises a magnetic alignment apparatus.

Aspect 43A. The apparatus unit of any one of aspects 1A to 42A, wherein the objects of interest comprise particles.

Aspect 44A. The apparatus unit of aspect 43, wherein the particles comprise dust particles, soot particles, water droplets, water molecules, or a combination of any of the foregoing.

Aspect 45A. The apparatus unit of any one of aspects 1A to 44A, wherein the alignment occurs within less than 10 mean free path lengths of the objects of interest.

Aspect 46A. The apparatus unit of aspect 45, wherein the alignment occurs within a fraction of one mean free time of the objects of interest.

Aspect 47A. The apparatus unit of any one of aspects 1A to 46A, wherein the apparatus unit comprises one throat.

Aspect 48A. The apparatus unit of any one of aspects 1A to 46A, wherein the apparatus unit comprises two or more throats.

Aspect 49A. The apparatus unit of any one of aspects 1A to 48A, wherein. the first throat opening is diffusively coupled to a first reservoir; and the second throat opening is diffusively coupled to a second reservoir.

Aspect 50A. A system comprising two or more of the apparatus units of any one of aspects 1A to 49A.

Aspect 51A. The system of aspect 50A, comprising a planar array of the apparatus units.

Aspect 52A. The system of aspect 51A, wherein the system comprises a plurality of the planar arrays, wherein at least one of the planar arrays are disposed above another planar array.

Aspect 53A. The system of any one of aspects 50A to 52A, further comprising two or more of the apparatus units coupled in series.

Aspect 54A. The system of aspect 53A, wherein a second throat opening of a first apparatus unit is diffusively coupled to a first throat opening of a second apparatus unit.

Aspect 55A. A method of selectively transmitting objects of interest from a first reservoir to a second reservoir, comprising: providing the apparatus unit of any one of aspects 1A to 49A, wherein the first throat opening is diffusively coupled to the first reservoir and the second throat opening is diffusively coupled to the second reservoir; and generating a force field by activating the first alignment apparatus; thereby causing a selective transmission of the objects of interest from the first reservoir to the second reservoir.

Aspect 55A. A method of selectively transmitting objects of interest from a first reservoir to a second reservoir, comprising: providing the system of any one of aspects 50A to 54A, wherein the first throat opening is diffusively coupled to the first reservoir and the second throat opening is diffusively coupled to the second reservoir; and generating a force field by activating the first alignment apparatus; thereby causing a selective transmission of the objects of interest from the first reservoir to the second reservoir.

The embodiments and methods described in this paper are only meant to exemplify and illustrate the principles of the invention. This invention can be carried out in several different ways and is not limited to the examples, embodiments, arrangements, configurations, or methods of operation described in this paper or depicted in the drawings. This also applies to cases where just one embodiment is described or depicted. Those skilled in the art will be able to devise numerous alternative examples, embodiments, arrangements, configurations, or methods of operation, that, while not shown or described herein, embody the principles of the invention and thus are within its spirit and scope.

What is claimed is:

1. An apparatus unit for selectively transmitting objects of interest, the apparatus unit comprising:
    bulk material;
    a throat disposed within the bulk material and extending from a first throat opening to a second throat opening, the throat being configured to diffusively couple a first reservoir of objects of interest via the first throat opening and a second reservoir of objects of interest via the second throat opening, the throat having a characteristic width that is less than 1000 times the mean free path length of the objects of interest in the first reservoir at the first throat opening, the throat being capable of diffusing objects of interest through the first throat opening in the direction from the first reservoir to the second reservoir and/or through the second throat opening in the direction from the second reservoir to the first reservoir; and a first focusing apparatus comprising an electric or magnetic field generating apparatus and capable of focusing in the proximity of the first throat opening the trajectories of at least a portion of the objects of interest diffusing from the first reservoir in the direction from the first reservoir to the second reservoir, the focusing occurring within a distance less than 1000 times the mean free path of the objects of interest from the first throat opening, the trajectories being focused towards and through the first throat opening or focused away from the first throat opening and reflected back towards the first reservoir, such that that there can be a net bulk flow of objects of interest through the throat from the first reservoir to the second reservoir or from the second reservoir to the first reservoir for an initial condition in which the properties of the medium in the first reservoir and the second reservoir are identical and uniform in space, at least a portion of the net bulk flow being a result of the interaction of objects of interest with the first focusing apparatus.

2. The apparatus unit of claim 1, wherein the first focusing apparatus has a length less than 1000 times the mean free path length of the objects of interest.

3. The apparatus unit of claim 1, wherein the focusing by the first focusing apparatus comprises a pushing or pulling of the objects of interest toward the first throat opening.

4. The apparatus unit of claim 1, wherein the electric or magnetic field generating apparatus of the first focusing apparatus comprises one or more charge collections.

5. The apparatus unit of claim 1, wherein the objects of interest comprise electrons, ions, charged dust particles, charged aerosols, permanent electric dipoles, induced electric dipoles, atoms, molecules, permanent magnetic dipoles, induced magnetic dipoles, quasiparticles, water molecules, water droplets, an object carrying a permanent electric charge, or a combination of any of the foregoing.

6. The apparatus unit of claim 1, wherein the objects of interest comprise photons, phonons, an electromagnetic wave, electrons, ions, quasiparticles, atoms, molecules, diatomic molecules, water molecules, dust particles, aerosols, objects having a permanent or induced electric dipole, objects having a permanent or induced magnetic dipole, objects having as a polarization axis, or a combination of any of the foregoing.

7. The apparatus unit of claim 1, wherein the apparatus unit is configured to change a property of the objects of interest in proximity of the first throat opening and/or the second throat opening, wherein the change in the property is relative to the same property of the object of interest in the first reservoir and/or the second reservoir respectively, wherein the change in the property is at least partially induced by interaction with the first focusing apparatus at the first throat opening and/or with a second focusing apparatus at the second throat opening.

8. The apparatus unit of claim 7, wherein the property is an average volumetric number density of the objects of interest at the first throat opening and/or the second throat opening.

9. The apparatus unit of claim 7, wherein the property is a vector property, of the Objects of interest at the first throat opening and/or the second throat opening.

10. The apparatus unit of claim 9, wherein the change in the vector property comprises a change in a polarization of the objects of interest with respect to the geometry of the first throat opening and/or the second throat opening.

11. The apparatus unit of claim 1, wherein
the first throat opening is diffusively coupled to the first reservoir with respect to the objects of interest of interest; and
the second throat opening is diffusively coupled to the second reservoir with respect to the objects of interest.

12. The apparatus unit of claim 11, wherein the first reservoir and/or the second reservoir comprises an electromagnetic field.

13. The apparatus unit of claim 12, further comprising:
a first reservoir focusing apparatus within the first reservoir and in proximity to the first throat opening; and/or
a second reservoir focusing apparatus within the second reservoir and in proximity to the second throat opening.

14. The apparatus unit of claim 1, wherein the focusing by the first focusing apparatus comprises a pushing or pulling of objects of interest away from the first throat opening.

15. The apparatus unit of claim 3 or claim 14, wherein the pulling or pushing of objects of interest is facilitated at least in part by an electric or magnetic field of the electric or magnetic field generating apparatus of the first focusing apparatus.

16. The apparatus unit of claim 1, wherein the first reservoir and/or the second reservoir comprise a gas, liquid, solid, vacuum, and/or a medium comprising the objects of interest, or a combination of any of the foregoing.

17. The apparatus unit of claim 1, wherein the first reservoir and the second reservoir are identical.

18. The apparatus unit of claim 1, wherein the first reservoir and/or the second reservoir comprise a metal, a semiconductor, and/or an electrical conductor.

19. The apparatus unit of claim 1, wherein the bulk material comprises a solid, a metal, a metal alloy, a composite, a glass, a thermoplastic, a thermoset, a ceramic, an insulator, an electrical insulator, a semiconductor, an electrical conductor, or a combination of any of the foregoing.

20. The apparatus unit of claim 1, wherein the objects of interest comprise neutrally charged objects, particles, dust particles, soot particles, aerosols, water molecules, water droplets, atoms, molecules, monatomic molecules, diatomic molecules, quasiparticles, distinct objects, distinct components of a medium, or a combination of any of the foregoing.

21. The apparatus unit of claim 1, wherein there is a net thrust on the apparatus unit in the direction from the second reservoir to the first reservoir associated with the bulk flow of the objects of interest from the first reservoir to the second reservoir, or wherein there is a net thrust on the apparatus unit in the direction from the first reservoir to the second reservoir associated with the bulk flow of the objects of interest from the second reservoir to the first reservoir.

22. The apparatus unit of claim 1, wherein the focusing of the trajectories of at least a portion of the objects of interest diffusing from the first reservoir in the direction from the first reservoir to the second reservoir comprises an increase in a flux of the at least a portion of the objects of interest at a second surface compared to a flux of the same objects of interest at a first surface, wherein the first surface is located a distance of less than 1000 mean free paths of objects of interest from the second surface in the direction from the second surface to the first reservoir, wherein the flux of the objects of interest is an average number of specified objects of interest passing through or coming into contact with the specified surface per unit area and per unit time, wherein an area of the first surface and an area of the second surface is the set of all possible points of incidence or intersection between the trajectories and the surface.

23. The apparatus unit of claim 22, wherein the second surface is the first throat opening.

24. The apparatus unit of claim 22, wherein the second surface is located at a reflective surface configured to reflect the objects of interest back towards the first reservoir.

25. The apparatus unit of claim 1, wherein the focusing of the trajectories of at least a portion of the objects of interest diffusing from the first reservoir in the direction from the first reservoir to the second reservoir comprises an increase in the average number density of objects of interest in the direction from the first reservoir to the second reservoir, wherein the increase occurs within a distance of less than 1000 mean free paths of objects of interest from the first through opening.

26. The apparatus unit of claim 25, wherein the increase is evident at the first throat opening.

27. The apparatus unit of claim 25, wherein the increase is evident at a reflective surface configured to reflect the objects of interest back towards the first reservoir.

28. The apparatus unit of claim 1, wherein a strength of an electric or magnetic field generated by the electric or magnetic field generating apparatus of the first apparatus is regulated.

29. The apparatus unit of claim 1, wherein a magnitude of an electric or magnetic field increases in the direction from the first reservoir towards the first throat opening within a distance less than 1000 times the mean free path of the objects of interest from the first throat opening, or wherein the magnitude of the electric or magnetic field decreases in the direction from the first reservoir towards the first throat opening within a distance less than 1000 times the mean free path of the objects of interest from the first throat opening.

30. The apparatus unit of claim 1, further comprising a second focusing apparatus comprising an electric or magnetic field generating apparatus and capable of focusing in the proximity of the second throat opening the trajectories of at least a portion of the objects of interest diffusing from the second reservoir in the direction from the second reservoir of the first reservoir, the focusing occurring within a distance less than 1000 times the mean free path of the objects of interest from the second throat opening, the trajectories being focused towards and through the second throat opening or focused away from the second throat opening and reflected back towards the second reservoir, such that that there can be a net bulk flow of objects of interest through the throat from the first reservoir to the second reservoir or from the second reservoir to the first reservoir for an initial condition in which the properties of the medium in the first reservoir and the second reservoir are identical and uniform in space, at least a portion of the net bulk flow being a result of the interaction of objects of interest with the second focusing apparatus.

31. The apparatus unit of claim 30, wherein the second focusing apparatus has a length less than 1000 times the free mean path length of the objects of interest.

32. The apparatus unit of claim 30, wherein the focusing by the second focusing apparatus comprises a pushing or pulling of the objects of interest away from the second throat opening.

33. The apparatus unit of claim 30, wherein the electric or magnetic field generating apparatus of the second focusing apparatus comprises one or more charge collections.

34. The apparatus unit of claim 30, wherein the focusing effect of objects of interest interacting with the first focusing apparatus in the proximity to the first throat opening is different in strength compared to the focusing effect of objects of interest interacting with the second focusing apparatus at the second throat opening.

35. The apparatus unit of claim 30, wherein the focusing by the second focusing apparatus comprises a pushing or pulling of objects of interest toward the second throat opening.

36. The apparatus unit of claim 30, wherein the focusing of the trajectories of at least a portion of the objects of interest diffusing from the second reservoir in the direction from the second reservoir to the first reservoir comprises an increase in the flux of the at least a portion of the objects of interest at a fourth surface compared to the flux of the same objects of interest at a third surface, wherein the third surface is located a distance of less than 1000 mean free paths of objects of interest from the fourth surface in the direction from the fourth surface to the second reservoir, wherein the flux of objects of interest is an average number of specified objects of interest passing through or coming into contact with the specified surface per unit area and per unit time, wherein an area of the third surface and an area of the fourth surface is the set of all possible points of incidence or intersection between the trajectories and the surface.

37. The apparatus unit of claim 36, wherein the fourth surface is the second throat opening.

38. The apparatus unit of claim 36, wherein the fourth surface is located at a reflective surface configured to reflect the objects of interest back towards the second reservoir.

39. The apparatus unit of claim 30, wherein the focusing of the trajectories of at least a portion of the objects of interest diffusing from the second reservoir in the direction from the second reservoir to the first reservoir comprises an increase in the average number density of objects of interest in the direction from the second reservoir to the first reservoir, wherein the increase occurs within a distance of less than 1000 mean free paths of objects of interest from the second throat opening.

40. The apparatus unit of claim 39, wherein the increase is evident at the second throat opening.

41. The apparatus unit of claim 39, wherein the increase is evident at a reflective surface configured to reflect the objects of interest back towards the second reservoir.

42. The apparatus unit of claim 1 or claim 30, wherein the focusing of the trajectories of at least a portion of the objects of interest comprises an increase in the average number density of the objects of interest.

43. The apparatus unit of claim 1 or claim 30, wherein the focusing of the trajectories of at least a portion of the objects of interest comprises a force acting between the focusing apparatus and the objects of interest.

44. The apparatus unit of claim 1 or claim 30, wherein the focusing of the trajectories of at least a portion of the objects of interest comprises at least one reflective collision between the objects of interest and the bulk material.

45. The apparatus unit of claim 44, wherein the focusing of the trajectories of at least a portion of the objects of interest comprises a plurality of reflective collisions between the objects of interest and the bulk material.

46. The apparatus unit of claim 45, wherein the focusing of the trajectories of at least a portion of the objects of interest comprises a plurality of consecutive reflective collisions between the objects of interest and the bulk material.

47. The apparatus unit of claim 1 or claim 30, wherein the focusing of the trajectories of at least a portion of the objects of interest comprises an adsorption of objects of interest onto a surface.

48. The apparatus unit of claim 30, wherein the first focusing apparatus is capable of focusing in the proximity of the first throat opening the trajectories of at least a portion of the objects of interest diffusing from the first reservoir in the direction from the first reservoir to the second reservoir, the focusing occurring within a distance less than 1000 times the mean free path of the objects of interest from the first throat opening, the trajectories being focused towards and through the first throat opening, and wherein the second focusing apparatus is capable of focusing in the proximity of the second throat opening the trajectories of at least a portion of the objects of interest diffusing from the second reservoir in the direction from the second reservoir to the first reservoir, the focusing occurring within a distance less than 1000 times the mean free path of the objects of interest from the second throat opening, the trajectories being focused away from the second throat opening and reflected back towards the second reservoir, such that that there can be a net bulk flow of objects of interest through the throat from the first reservoir to the second reservoir for an initial condition in which the properties of the medium in the first reservoir and the second reservoir are identical and uniform in space, at least a portion of the net bulk flow being a result of the interaction of objects of interest with the first focusing apparatus and/or the second focusing apparatus.

49. The apparatus unit of claim 30, wherein a magnitude of an electric or magnetic field increases in the direction from the second reservoir towards the second throat opening within a distance less than 1000 times the mean free path of the objects of interest from the second throat opening, or wherein the magnitude of the electric or magnetic field decreases in the direction from the second reservoir towards the second throat opening within a distance less than 1000 times the mean free path of the objects of interest from the second throat opening.

50. The apparatus unit of claim 1 or claim 30, wherein the magnetic field generating apparatus comprises an electromagnet or a permanent magnet.

51. The apparatus unit of claim 32 or claim 35, wherein the pulling or pushing of objects of interest is facilitated at least in part by an electric or magnetic field of the electric or magnetic field generating apparatus of the second focusing apparatus.

52. The apparatus unit of claim 30, wherein a strength of an electric or magnetic field generated by the electric or magnetic field generating apparatus of the second focusing apparatus can be regulated.

53. The apparatus unit of claim 30, wherein the magnetic field generating apparatus of the second focusing apparatus comprises an electromagnet or a permanent magnet.

54. A system comprising two or more instances of the apparatus unit of claim 1, wherein the two or more instances of the apparatus unit are diffusively, coupled in parallel.

55. The system of claim 54, further comprising one or more instances of the apparatus unit diffusively coupled in series with at least one of the two or more instances of the apparatus unit of claim 54.

56. A system comprising a planar array of at least two instances of the apparatus unit of claim 1.

57. A system comprising at least 1000 instances of the apparatus unit of claim 1 diffusively coupled in parallel.

58. A system comprising two or more instances of the apparatus unit of claim 1, wherein the two or more instances of the apparatus unit are diffusively coupled in series.

59. A system comprising at least 100 instances of the apparatus unit of claim 1 diffusively coupled in series.

* * * * *